(12) United States Patent
Hori et al.

(10) Patent No.: US 6,506,544 B1
(45) Date of Patent: Jan. 14, 2003

(54) EXPOSURE METHOD AND EXPOSURE APPARATUS AND MASK

(75) Inventors: Kazuhiko Hori, Chiyoda-ku (JP); Katsuya Machino, Chiyoda-ku (JP); Manabu Toguchi, Chiyoda-ku (JP); Masahiro Iguchi, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/430,179

(22) Filed: Oct. 29, 1999

(30) Foreign Application Priority Data

Nov. 4, 1998 (JP) .......................................... 10-313798
Jun. 7, 1999 (JP) .......................................... 11-160267

(51) Int. Cl.⁷ .............................. G03C 5/00; G03F 9/00
(52) U.S. Cl. .......................... 430/394; 430/5; 430/296
(58) Field of Search ................................ 430/5, 22, 30, 430/313, 312, 320, 322, 324, 323, 394, 296

(56) References Cited

U.S. PATENT DOCUMENTS

| | | | |
|---|---|---|---|
| 4,748,478 A | 5/1988 | Suwa et al. ................ 355/53 |
| 4,878,086 A | 10/1989 | Isohata et al. ................ 355/77 |
| 5,486,896 A | * 1/1996 | Hazama et al. ................ 355/71 |
| 6,213,607 B1 | * 4/2001 | Watanabe et al. ............ 359/601 |

FOREIGN PATENT DOCUMENTS

| JP | A-6-244077 | 9/1994 |
|---|---|---|
| JP | A-7-235466 | 9/1995 |

* cited by examiner

*Primary Examiner*—Mark F. Huff
*Assistant Examiner*—Saleha R. Mohamedulla
(74) *Attorney, Agent, or Firm*—Oliff & Berridge, PLC

(57) ABSTRACT

In the exposure method of the invention, a first pattern and a second pattern are joined and exposed on a substrate using a mask having a pattern. The pattern on the mask has a common pattern for the first pattern and the second pattern, and a non-common pattern different from the common pattern and formed continuously with the common pattern. The common pattern and at least a part of the non-common pattern are selected to effect the joining and exposing. According to this method, the number of masks required for exposure processing accompanying screen synthesis can be reduced.

10 Claims, 25 Drawing Sheets

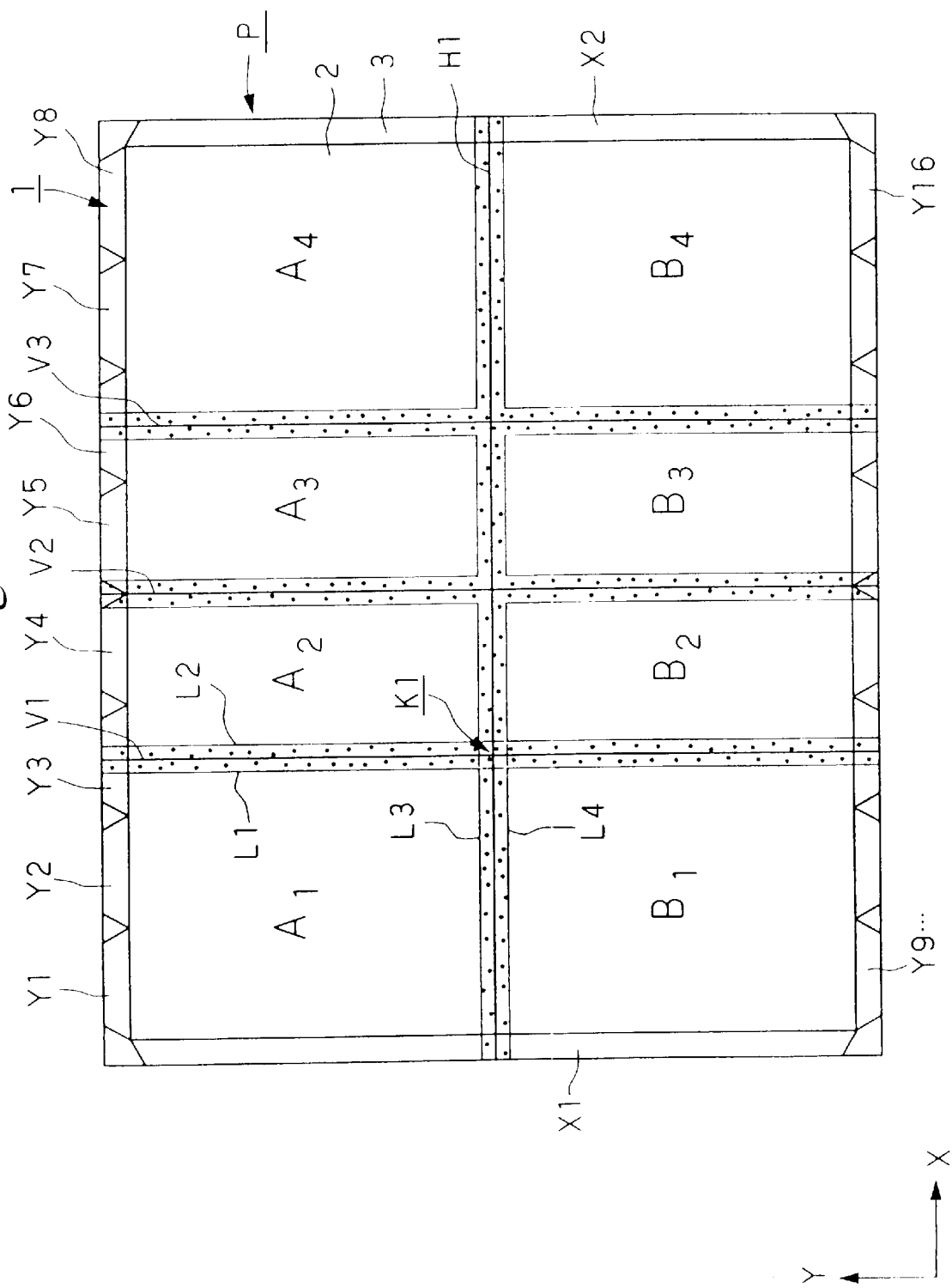

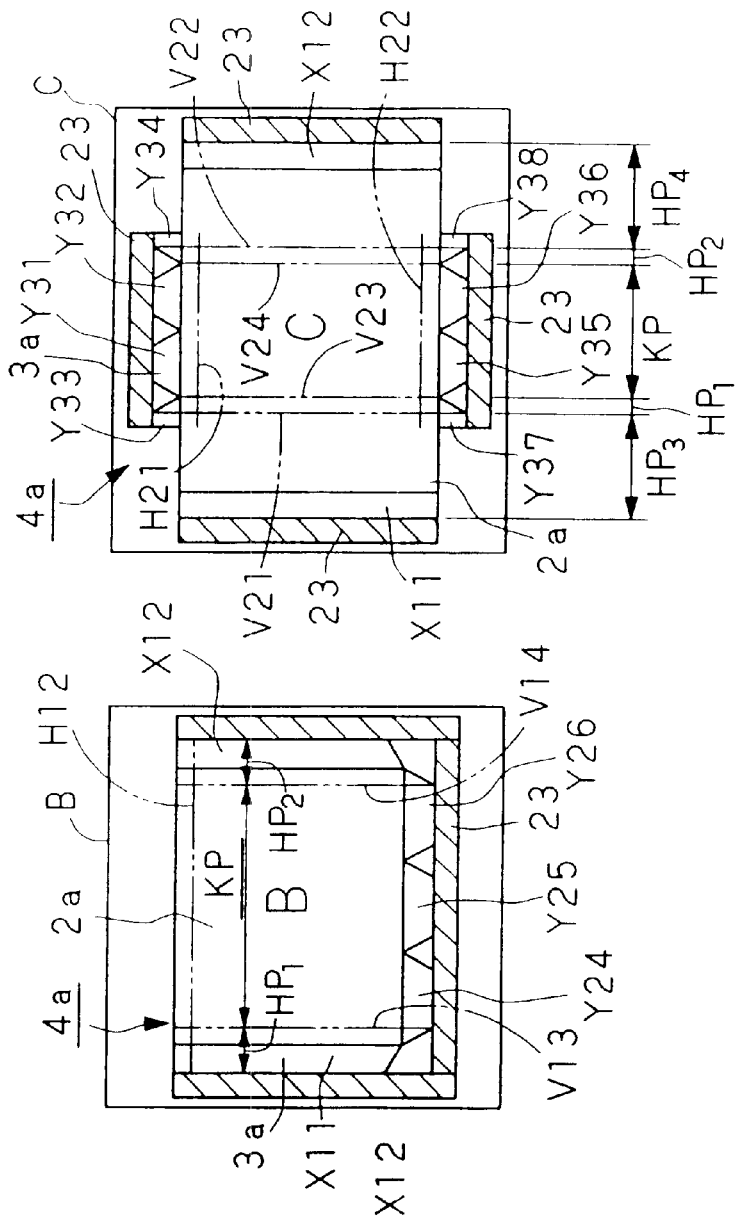

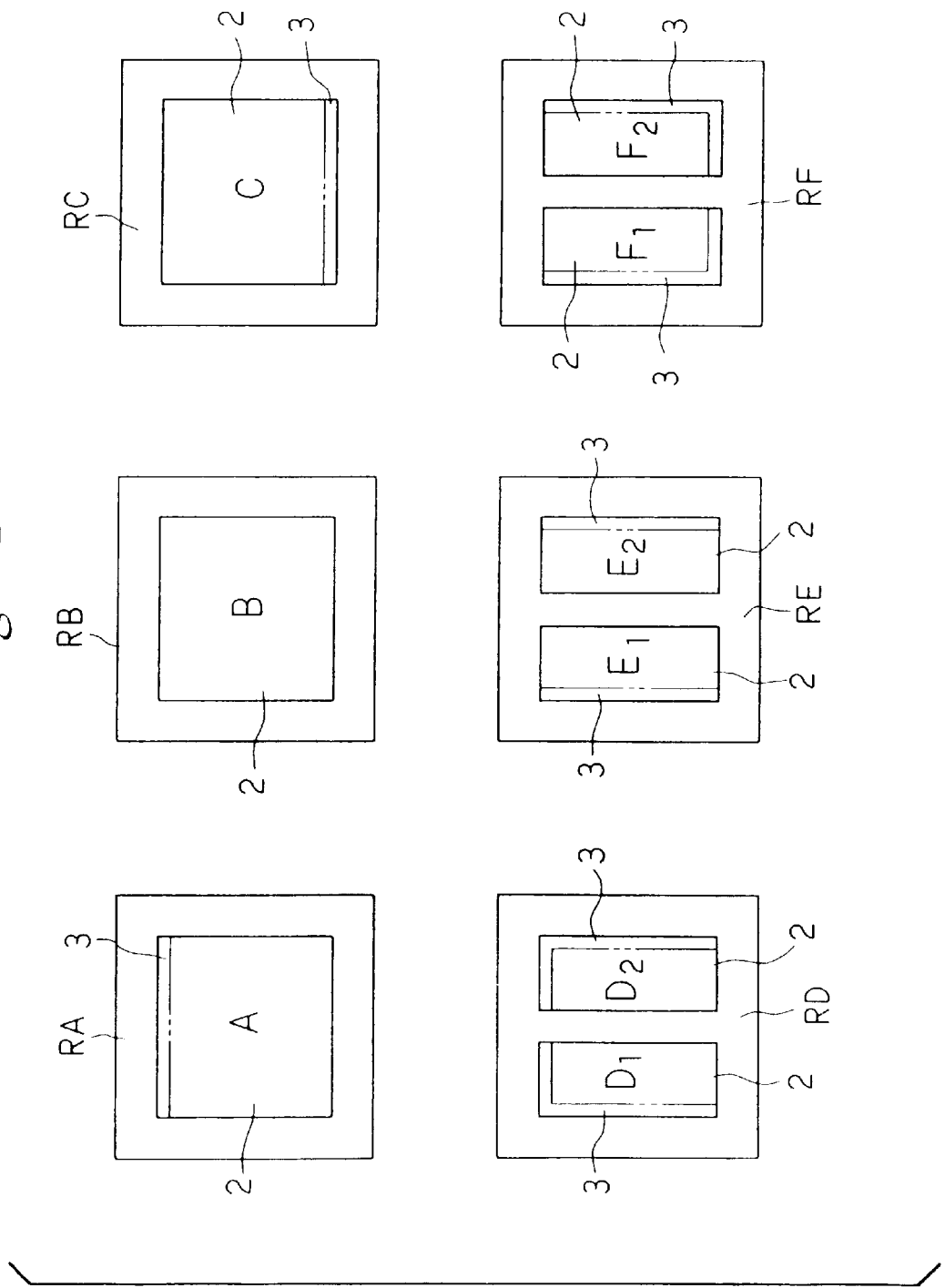

EXPOSURE METHOD AND EXPOSURE APPARATUS AND MASK

BACKGROUND OF THE INVENTION

1. Field of the Invention

The present invention relates to a mask for transferring an illuminated pattern to a transfer area, and an exposure method and an exposure apparatus for transferring the pattern on the mask to a transfer area on a substrate. More specifically, the present invention relates to an exposure method and an exposure apparatus, and a mask suitable for pattern joining exposure at a transfer area on a substrate.

2. Description of the Related Art

In general, as an exposure apparatus for producing a liquid crystal display element or the like, there is one involving a so-called step and repeat method (stepper) in which after exposure of a pattern formed on a mask onto a predetermined exposure area on a photosensitive substrate, the photosensitive substrate is stepped by a certain distance, and exposure of the pattern of the mask is repeated.

Conventionally, when for example an LCD pattern for a liquid crystal display element having a large area is formed by the stepper, a screen synthesis method has been normally used.

With this screen synthesis method an LCD pattern in which a plurality of patterns are synthesized, is formed on a glass substrate using a plurality of masks corresponding to respective divided LCD patterns, by a method where after a pattern on a mask has been exposed onto an exposure area of the glass substrate corresponding to one mask, the glass substrate is stepped and the mask is changed to another mask, and a pattern on the mask is exposed onto an exposure area corresponding to that mask.

FIG. 38 is a pattern diagram in which a circuit pattern 1 of a glass substrate (substrate) P used at the time of production of a 15-inch liquid crystal display device is severally divided (into 6 in the figure).

The circuit pattern 1 has an approximate square shape, and comprises a display section 2 and a peripheral section 3. The display section 2 comprises a pattern in which a plurality of electrodes corresponding to a plurality of pixels are disposed regularly. The peripheral section 3 is formed so as to surround the display section 2, and has a conductive section for connecting a pattern of each electrode in the display section 2 to a driver circuit (not shown) for driving the respective electrodes. The circuit pattern 1 is constructed such that the circuit pattern is synthesized by divided patterns A to F including the display section 2 and the peripheral section 3.

On the other hand, FIG. 39 is a plan view of masks RA to RF on which patterns corresponding to these divided patterns A to F are formed. With a stepper using these masks RA to RF, for example, the mask RA is first attached, and a glass substrate P is shifted to a predetermined position corresponding to the divided pattern A and then exposed, to thereby transfer the divided pattern A onto the glass substrate P.

Then, the mask RA is changed to the mask RB, and the glass substrate P is shifted to a predetermined position corresponding to the divided pattern B and then exposed, to thereby transfer the divided pattern B onto the glass substrate P. The divided patterns A to F are transferred to the glass substrate P by repeating his operation sequentially.

Moreover, FIG. 40 is a pattern diagram wherein a circuit pattern 4 of a glass substrate (substrate) P used at the time of production of a 21-inch liquid crystal display device is severally divided (into 15 in this figure). As described above, the circuit pattern 4 has such a construction as to be synthesized by divided patterns A to F2 including the display section 2 and the peripheral section 3. In this example, since a part of the display section 2 has a pattern where the divided patterns A, B and C are repeated, a plurality of shots are exposed with the same mask (for example, a mask having an A pattern). FIG. 41 shows masks RA to RF in which patterns corresponding to these divided patterns A to F2 are formed. Also in this case, as described above, by changing the masks sequentially, and shifting the glass substrate P to a predetermined position to thereby effect the exposure, the circuit pattern 4 is screen-synthesized.

When the above described screen synthesis method is performed, a difference in level occurs at a joint portion of the pattern due to a pattern rendering error of the mask, aberration of the lens of the projection optical system, positioning error of a stage where the glass substrate is to be stepped or the like, thereby impairing the properties of the device. Moreover, when the screen-synthesized divided patterns are overlapped in multiple layers, overlap error of the exposure area of each layer, and line width difference of the pattern change discontinuously at the joint portion of the patterns. Hence, to prevent the quality of the device from being degraded, a so-called pattern joining exposure is carried out.

This pattern joining exposure is to join and expose the joint portions in adjacent exposure areas, and in each exposure area, to proportionally reduce the exposure quantity (exposure energy quantity) in this joint portion toward the boundary by changing, for example, the exposure time, to thereby approximately match the exposure quantity in this portion with the exposure quantity in other portions, when the exposure is effected by overlapping the exposure areas. The pattern joining exposure is disclosed for example in Japanese Patent Application, First Publication Nos. Hei 6-244077 and Hei 7-235466.

However, the conventional exposure methods and exposure apparatuses and masks described above have the following problems.

Of the patterns formed on the respective masks RA to RF, the pattern in the display section 2 is such that a plurality of electrodes corresponding to pixels are regularly disposed. Therefore, even if the pattern is severally divided, a common alignment pattern partially exists in the respective divided patterns A to F.

With the divided patterns A to F however, the existence of the peripheral section 3 or the position to be connected by the peripheral section 3 is different, depending upon the position of the divided display section 2. Therefore, even if there is a partially common pattern, masks RA to RF corresponding to the divided patterns A to F must be prepared, which imposes a big burden on the cost. Moreover, if the number of masks increases, the time required for changing the masks also increases, causing a problem in that improvement of throughput is hindered.

SUMMARY OF THE INVENTION

In view of the above situation, it is an object of the present invention to provide a mask, and an exposure method and an exposure apparatus using this mask, wherein when exposure processing accompanying screen synthesis is performed for producing a device, cost can be reduced and throughput improved by exposing only a small number of masks.

To achieve the above described object, the present invention adopts the following construction.

The exposure method of the present invention is an exposure method for joining and exposing a first pattern and a second pattern on a substrate using a mask having a pattern, wherein the pattern on the mask has a common pattern for the first pattern and the second pattern, and a non-common pattern different from the common pattern and formed continuously with the common pattern, and the common pattern and at least a part of the non-common pattern are selected to effect the joining and exposing.

Therefore, with the exposure method of the present invention, when the second pattern is subjected to the pattern joining exposure after the first pattern is exposed on the substrate, the common pattern common to the first pattern and at least a part of the non-common pattern different from the common pattern can be selected for use. Hence, at the time of exposure of the second pattern, there is no need to separately prepare a mask having the second pattern.

Moreover, with this exposure method, a pattern on the mask can be multiply transferred to a plurality of exposure areas with one mask so that the patterns become different. Hence the time required for changing the masks can be reduced, and the throughput can be improved. In addition to this effect, since the number of masks to be used, which are very expensive, can be also reduced, there is also the resultant effect of realizing a cost reduction. This effect becomes particularly significant when the same pattern is repeatedly transferred, as with a liquid crystal display device or a semiconductor memory.

The exposure method in an other embodiment of the present invention is constructed such that the non-common pattern is formed on either side of the common pattern. With this exposure method, the time required for selecting the first pattern and the second pattern can be reduced. Hence the effect is obtained in that further improvement of the throughput can be realized.

The exposure method in an other embodiment of the present invention is constructed such that selection of the non-common pattern is different for when the first pattern is exposed to when the second pattern is exposed. With this exposure method, the first and second patterns having different patterns can be transferred with one mask. Hence the effect can be obtained that in addition to obtaining the effect that the time required for changing the masks can be reduced and the throughput can be improved, the cost can also be reduced due to the reduction in the number of expensive masks to be used.

The exposure method in an other embodiment of the present invention is constructed such that selection of masks is set by an illumination area of the mask, and an exposure area on the substrate corresponding to the illumination area is overlapped on an adjacent exposure area. With this exposure method, by setting the illumination area, the effect can be obtained that a pattern can be multiply transferred to a plurality of exposure areas with one mask so that patterns become different.

Moreover, when the exposure areas on the substrate corresponding to the illumination areas are arranged in a rectangular shape so that two sides thereof are overlapped respectively, a light attenuation area where the transmittance gradually changes is formed on one side of the illumination area, and the illumination areas corresponding to each exposure area can be shifted respectively along the above-mentioned one side (in the X direction) during exposure. In this way, the exposure area on the substrate corresponding to the light attenuation area is exposed with the gradually changing exposure energy quantity. In the exposure area adjacent to this exposure area, the exposure energy quantity in the overlap portion can be made the same as that for other portions, by overlapping in the light attenuation area.

Hence, according to this exposure method, overexposure is not caused even in an area where the exposure areas intersect, and an effect can be obtained that the exposure can be effected with the same exposure quantity as with other exposure areas. Moreover, in this case, since the movement of the illumination area setting device is in one direction, an effect can be obtained that a drive mechanism for driving the illumination area setting device can be made simple.

Furthermore, when the exposure areas are arranged in a rectangular shape as described above, pairs are formed by the exposure area sets whose sides are overlapped, and in each pair, the illumination areas corresponding to the exposure area can be respectively shifted along the same direction (in the diagonal direction) during the exposure. Hence, in the intersection portion of the exposure areas disposed in the rectangular shape, exposure can be effected with half the energy quantity of others. Moreover also in the remaining pairs, by shifting the illumination areas in the same direction during the exposure, the intersection portion can be exposed with half the energy quantity of the other areas, and the combined exposure quantity becomes the same as the exposure quantity of the other areas. Hence, with this exposure method, overexposure is not caused even in an area where the exposure areas intersect, and an effect can be obtained that the exposure can be effected with the same exposure quantity as with other exposure areas.

The exposure method in an other embodiment of the present invention is constructed such that the same direction to which the illumination areas are shifted is the diagonal direction in the rectangular arrangement. With this exposure method, even when two orthogonal sides are overlapped and exposed at a time with the adjacent exposure area, overexposure is not caused even in an area where the exposure areas intersect. Hence an effect can be obtained that the exposure can be effected with the same exposure quantity as with other exposure areas.

The mask of the present invention is characterized in that corresponding to a plurality of patterns, a common pattern for the plurality of patterns and a non-common pattern different from the common pattern are continuously formed.

Therefore, with the mask of the present invention, by combining the common pattern and the non-common pattern different from the common pattern, one mask can correspond to a plurality of patterns. Hence, an effect can be obtained that the number of masks to be used can be reduced, thus realizing a cost reduction.

The mask in an other embodiment of the present invention is constructed such that the non-common pattern is formed on either side of the common pattern. With this mask, when a pattern including a common pattern is set, an effect can be obtained that the time required for the setting can be reduced.

The exposure apparatus of the present invention is an exposure apparatus comprising; a mask stage for holding a mask having a pattern, and an illumination optical system for illuminating the mask, for exposing the mask pattern on a substrate, wherein the mask is held on the mask stage, and the exposure apparatus comprises an illumination area setting device for setting the illumination area of the mask to at least a first illumination area and a second illumination area, and a control unit for joining a first pattern exposed on the substrate by means of the first illumination area and a second pattern exposed on the substrate by means of the second illumination area.

Therefore, with the exposure apparatus of the present invention, the illumination area of the mask held on the mask stage is set in the first illumination area using the illumination area setting device, so that the first pattern having at least a common pattern can be exposed on the substrate. Then, by setting the illumination area of the mask in the second illumination area using the illumination area setting device, a second pattern having at least a common pattern can be exposed on the substrate. At this time, the first and second patterns exposed on the substrate are joined by control of the control unit.

Hence with this exposure apparatus, by setting the illumination area by the illumination area setting device, a plurality of patterns can be set with one mask. Hence the effect can be obtained that in addition to obtaining the effect that the time required for changing the masks can be reduced and the throughput can be improved, the cost can be also reduced due to the reduction in the number of expensive masks to be used.

The exposure apparatus in an other embodiment of the present invention is constructed such that the illumination area setting device sets the illumination area of the mask in the first and second illumination areas in accordance with the position of a transmission portion formed by a plurality of sides, and the control unit joins the first and second patterns in the first and second illumination areas on the substrate, and the illumination area setting device incorporates a plurality of side constituents and a shift apparatus for shifting the side constituents respectively and independently.

With this exposure apparatus, the effect can be obtained that, illumination areas having different sizes and positions can be variously set according to the situation, exposure and shading of the light attenuation portion can be easily done, and pattern joining exposure having wide generality can be achieved.

The exposure apparatus in an other embodiment of the present invention is constructed such that a light attenuation portion where the transmission gradually decreases is provided on at least one side of the transmission portion. With this exposure apparatus, by shifting the illumination area along one side where the light attenuation portion is disposed during the exposure, overexposure is not caused even in an area where the exposure areas intersect. Hence an effect can be obtained that the exposure can be effected with the same exposure quantity as with other exposure areas. Moreover, in this case, the movement of the illumination area setting device is in one direction. Hence an effect can also be obtained that a drive mechanism for driving the illumination area setting device can be made simple.

The exposure apparatus in an other embodiment of the present invention is constructed such that there is provided a shift apparatus for respectively shifting the illumination areas corresponding to the exposure areas whose sides overlap to form a pair, along the same direction, when the exposure areas are arranged as a plurality of rectangles so that respective two sides thereof are overlapped. With this exposure apparatus, overexposure is not caused even in an area where the exposure areas intersect. Hence an effect can be obtained that the exposure can be effected with the same exposure quantity as with other exposure areas.

The exposure apparatus in an other embodiment of the present invention is constructed such that the same direction to which the illumination areas are shifted is the diagonal direction of the rectangular arrangement. With this exposure apparatus, when two orthogonal sides are overlapped and exposed at a time with the adjacent exposure area, overexposure is not caused even in an area where the exposure areas intersect. Hence an effect can be obtained that the exposure can be effected with the same exposure quantity as with other exposure areas.

The exposure apparatus in an other embodiment of the present invention is constructed such that the control unit drives the substrate stage in accordance with the setting of the illumination area setting device. With this exposure apparatus, the substrate stage drives in accordance with the setting of the illumination area setting device, to thereby transfer a plurality of patterns onto the substrate, with one mask. Hence the effect can be obtained that in addition to obtaining the effect that the time required for changing the masks can be reduced and the throughput can be improved, the cost can be also reduced due to the reduction in the number of expensive masks to be used.

BRIEF DESCRIPTION OF THE DRAWINGS

FIG. 2 is a pattern diagram of a glass substrate wherein a circuit pattern transferred by the reticle is severally divided.

FIGS. 25A to 25C are plan views of three reticles used at the time of exposure of the glass substrate.

FIG. 41 is a plan view showing one example of a mask according to conventional technology.

DESCRIPTION OF THE PREFERRED EMBODIMENTS

Figure 1A:
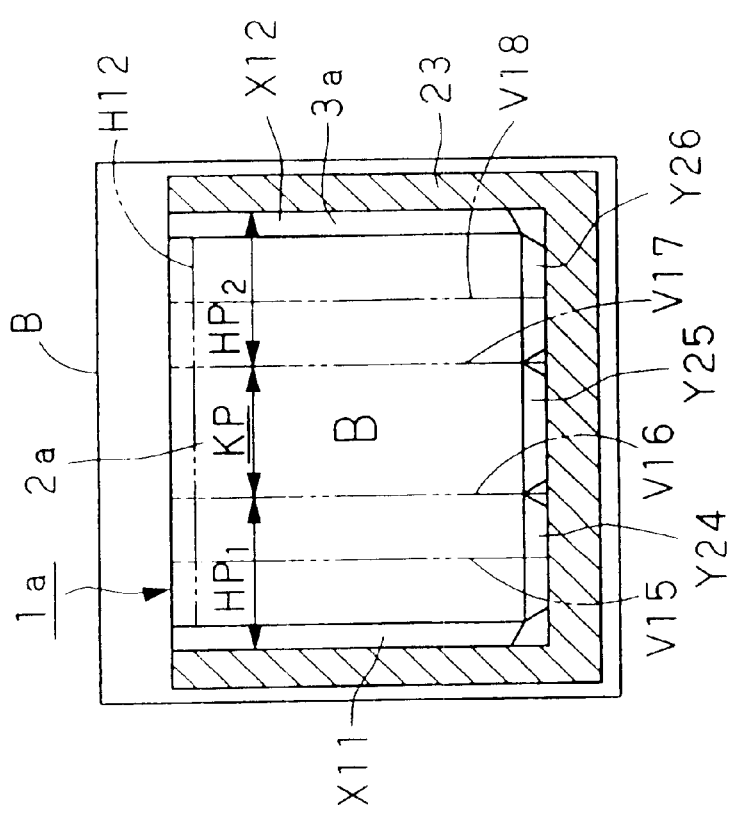
FIG. 1A and FIG. 1B are views showing a first embodiment of the present invention, being plan views of a reticle having a common pattern and a non-common pattern.

Below is a description of a first embodiment of an exposure method, an exposure apparatus and a mask according to the present invention, with reference to FIG. 1 to FIG. 23. Here, an example of a glass substrate for producing a 15-inch liquid crystal display device will be explained.

In these figures, the same reference numerals are given to constituents similar to those in FIG. 38 to FIG. 41 shown as conventional examples, and description thereof is omitted.

Figure 3:
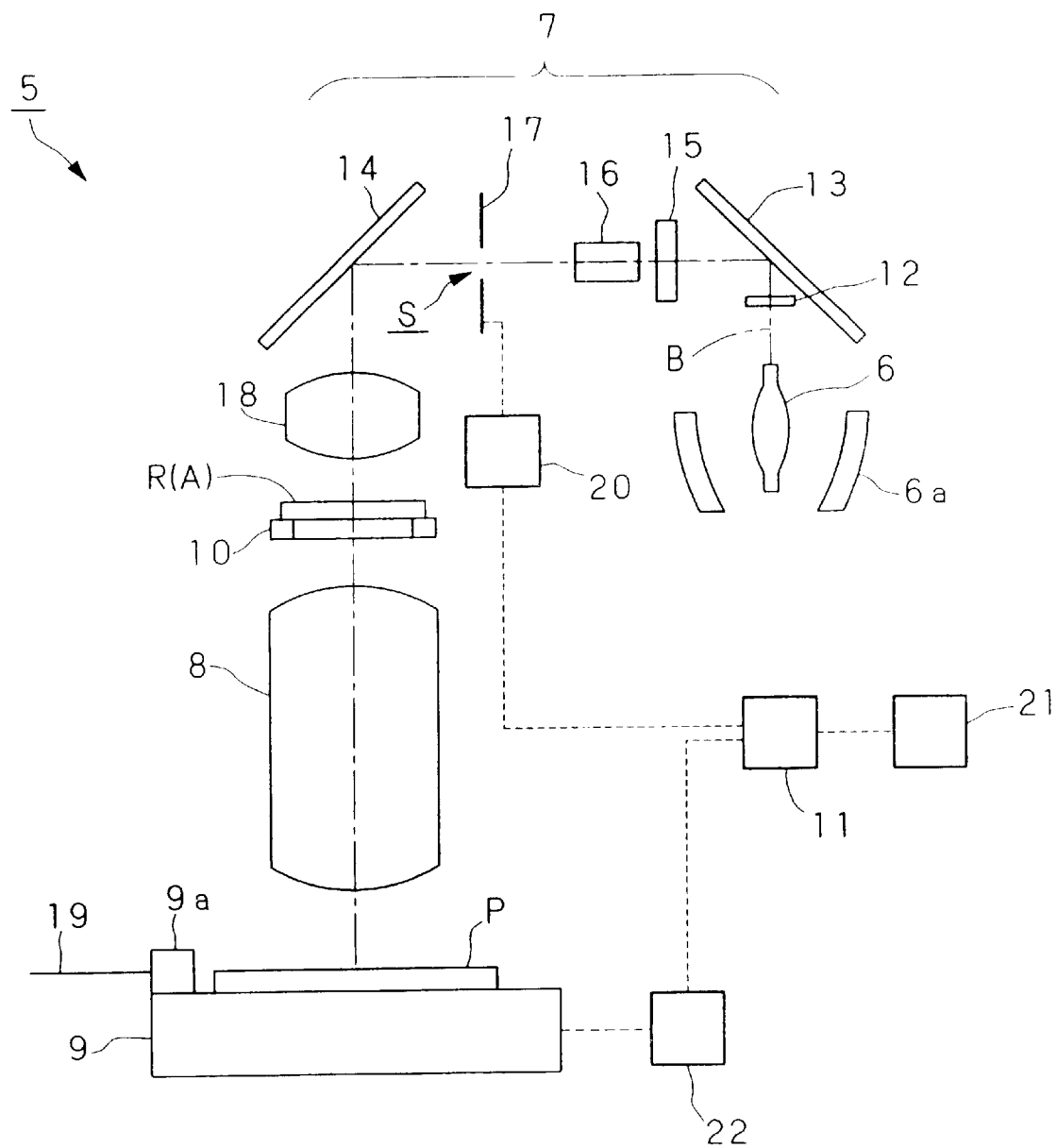
FIG. 3 is a view showing a first embodiment of the present invention, being a schematic diagram of an exposure apparatus wherein a drive control unit is connected to a reticle blind and a substrate stage.

FIG. 3 is a schematic construction diagram of an exposure apparatus 5.

The exposure apparatus 5 is for projecting and transferring a pattern (for example, a liquid crystal display element pattern) formed on a reticle (mask) R onto a square glass substrate (substrate) P, and is generally constituted by a mercury lamp 6, an illumination optical system 7, a projection optical system 8, a substrate stage 9, a reticle stage (mask stage) 10, an exposure data setting section 21 and a drive control unit (control unit) 11.

The mercury lamp 6 is for generating a beam B as the illumination light. The mercury lamp 6 is provided with an elliptic mirror 6a. The elliptic mirror 6a is for focusing the illumination light generated by the mercury lamp 6.

The illumination optical system 7 is generally constituted by a shutter 12, reflection mirrors 13 and 14, a wavelength selection filter 15, a fly eye integrator 16, a reticle blind (illumination area setting device) 17, and a condenser lens 18. The shutter 12 is for opening and closing the optical path of the beam B for a predetermined time period. The reflection mirror 13 is for reflecting the beam B focused by the elliptic mirror 6a and output in response to the opening operation of the shutter 12, toward the wavelength selection filter 15. The reflection mirror 14 is for reflecting the beam B passing through the reticle blind 17, toward the condenser lens 18.

The wavelength selection filter 15 is for passing only light included in the beam B having a wavelength necessary for the exposure (g-line and i-line).

The fly eye integrator 16 is for making uniform the illumination distribution of the beam B which has passed through the wavelength selection filter 15.

The condenser lens 18 is for imaging at the reticle R an image in the illumination area set by the opening S of the reticle blind 17.

Figure 4A:
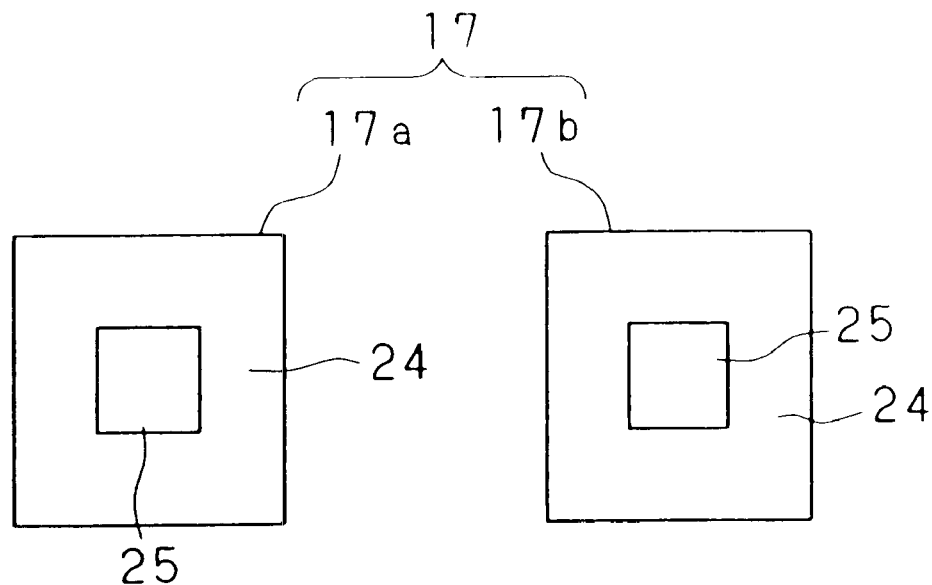
FIG. 4A is a plan view of a blind plate comprising a shading portion and a transmission portion of a reticle blind constituting the exposure apparatus of the present invention.

The reticle blind 17 is for setting the illumination area of the reticle R which is illuminated by the beam B passing through the fly eye integrator 16 and the half mirror 13, and as shown in FIG. 4A, comprises blind plates 17a and 17b which are shifted in mutually orthogonal directions in a plane orthogonal to the beam B, and are formed from rectangular glass materials arranged so that a conjugated plane of the reticle R is disposed therebetween. The respective blind plates 17a and 17b are provided with a shading portion 24 vacuum deposited with chromium to give shading, and a rectangular transmission portion 25 through which the beam B passes. With the reticle blind 17, the blind plates 17a and 17b are shifted to combine each transmission portion 25, to thereby form the opening S depending on the extent that the transmission portions 25 overlap. Moreover, the size of the opening S is changeable for each exposure, and the opening S is also movable in mutually orthogonal directions while keeping a constant opening width in each direction.

Furthermore, the reticle blind 17 shifts at a constant speed during the exposure, to thereby change the exposure quantity accompanying the change in the position of the opening S, decreasing at a certain ratio the exposure quantity, that is, the exposure energy quantity to the exposure area on the glass substrate P corresponding to the changed portion of the position of the opening S. The reticle blind 17 is provided with a drive mechanism (shift apparatus) 20 for driving the blind plates 17a and 17b of the reticle blind 17, by means of a feed mechanism (not shown) combining a servo motor and a ball screw.

The projection optical system 8 is for imaging an image of a pattern existing in the illumination area of the reticle R, onto the glass substrate P.

The reticle stage 10 is for holding the reticle R. The reticle stage 10 is provided with a reticle changing apparatus (not shown) for changing the reticle R.

The substrate stage 9 is for holding the glass substrate P, and is movable in mutually orthogonal directions. On the substrate stage 9 there is disposed a mobile mirror 9a.

The construction is such that a laser beam 19 is shone onto the mobile mirror 9a from a laser interferometer (not shown) serving as a position measuring apparatus, and based on the interference between the reflected light and the incident light thereof, the distance between the mobile mirror 9a and the laser interferometer, that is, the position of the substrate stage 9 (and the glass substrate P) is detected. Moreover, the substrate stage 9 is provided with a drive mechanism 22 such as a linear motor or the like, for driving the substrate stage 9.

The exposure data setting section 21 is for inputting as the exposure data, data relating to the exposure area, such as respective coordinate positions, sizes and the like of the divided areas obtained by dividing up one exposure area, and data relating to the pattern joining exposure where a part of the adjacent divided areas are overlapped to effect the exposure.

The drive control unit 11 is constructed so as to drive the reticle blind 17 via the drive mechanism 20 so that the adjacent divided areas are joined and exposed based on the exposure data set by the exposure data setting section 21, as well as to drive the substrate stage 9 via the drive mechanism 22.

On the other hand, as shown in FIG. 2, a circuit pattern 1 transferred to the glass substrate P comprises a display section 2 and a peripheral section 3. The display section 2 comprises a pattern in which a plurality of electrodes corresponding to a plurality of pixels are regularly disposed. The peripheral section 3 is formed so as to surround the display section 2, and has a conductive section for respectively connecting the pattern of each electrode in the display section 2 to a driver circuit for driving each of these electrodes. This conductive section comprises trapezoidal tabs X1 and X2 respectively disposed one each at opposite ends in the X direction of the display section 2, and trapezoidal tabs Y1 to Y8 and Y9 to Y16 respectively disposed so as to abut against each other at opposite ends in the Y direction of the display section 2, being eight tabs per end at regular intervals.

The circuit pattern 1 is constructed such that it is synthesized by divided patterns A1 to A4 and B1 to B4, each including the display section 2 and the peripheral section 3, divided by division lines V1 to V3 extending in the Y direction at predetermined intervals in the X direction, and a division line H1 extending in the X direction. Here, the division line V1 is set so as to pass through the center of the tab Y3, the division line V3 is set so as to pass through the center of the tab Y6. Moreover, the division line V2 is set so as to pass between the tab Y4 and the tab Y5.

Figure 1B:
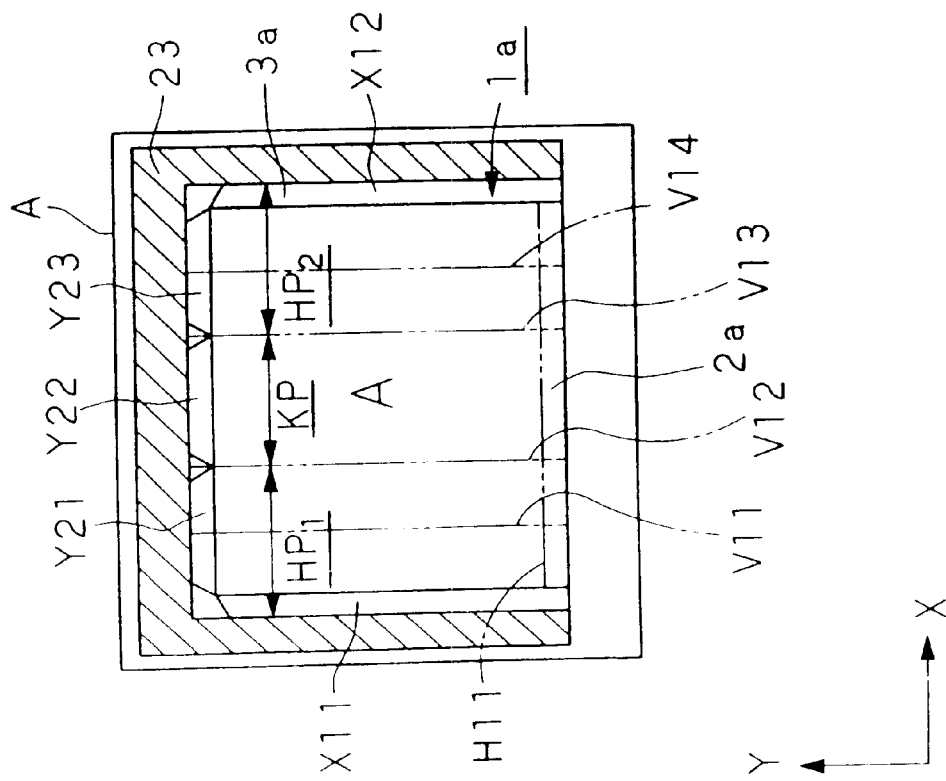

The reticle R for transferring this circuit pattern 1 has a construction using two reticles, that is, a reticle (mask) A shown in FIG. 1A and a reticle (mask) B shown in FIG. 1B. The reticle A is the one used at the time of transferring the divided patterns A1 to A4, and on the surface thereof, there is formed with a predetermined projection magnification with the glass substrate P, a circuit pattern (pattern) 1a consisting of the display section 2a and the peripheral section 3a, and a shading zone 23 on which chromium is vacuum deposited.

The peripheral section 3a comprises tabs X11 and X12 disposed at opposite ends in the X direction of the display section 2a, and three tabs Y21 to Y23 disposed at the end in the +Y direction of the display section 2a. The tabs X1 and X12 have about one half in the +Y direction including a little in the −Y direction from the division line H1, of the pattern which is transferred to the tabs X1 and X2 on the glass substrate P. Similarly, the tabs Y21 to Y23 respectively have the patterns to be transferred to the tabs Y1 to Y8 on the glass substrate P.

The display section 2a partially has the pattern in the display section 2 to be transferred to the glass substrate P. The width of the display section 2a is the total length of three tabs Y21 to Y23 in the X direction, and in the Y direction, the display section 2a has a length corresponding to about one half in the +Y direction including a little in the −Y direction from the division line H1, of the pattern which the display section 2 transfers, as with the above described tabs H11 and X12,.

The shading zone 23 is for shading the beam B at the time of pattern joining exposure, and is formed on the periphery of three sides of the circuit pattern 1a, excluding the side in the −Y direction. As the pattern joining exposure in this embodiment, a method is used in which a part of the adjacent patterns to be exposed (exposure area) are overlapped and exposed.

Moreover, in the reticle A, as shown in FIG. 1A, a division line V11 is set so as to extend in the Y direction, passing through the center of the tab Y21 located at the left end, and a division line V14 is set so as to extend in the Y direction, passing through the center of the tab Y23 located at the right end. Furthermore, a division line V12 is set so as to extend in the Y direction, passing between the left end tab Y21 and the center tab Y22, and a division line V13 is set so as to extend in the Y direction, passing between the right end tab Y23 and the center tab Y22. Similarly, a division line H11 is set so as to extend in the X direction, at a position corresponding to the division line H1.

The circuit pattern 1a of the reticle A is divided into a common pattern KP and non-common patterns HP1 and HP2 different from the common pattern KP, at the time of exposure onto the adjacent two divided patterns. The common pattern KP is set so as to be transferred commonly to both these divided patterns. The non-common patterns HP1 and HP2 are continuous with the common pattern KP, and are set so as to be formed with the common pattern KP therebetween. Then, at the time of exposure of each divided pattern, the common pattern KP and at least a part of the non-common patterns HP1 and HP2 are selected.

The reticle B is for use at the time of transferring the divided patterns B1 to B4, and since this has a similar construction to that of the reticle A, this will only be described in brief. The peripheral section 3a is provided with tabs X11 and X12 located at opposite ends in the X direction of the display section 2a, and three tabs Y24 to Y26 located at an end in the −Y direction of the display section 2a. The tabs X11 and X12 have about one half in the −Y direction including a little in the +Y direction from the division line H1, of the pattern which is transferred to the tabs X1 and X2 on the glass substrate P. Similarly, the tabs Y24 to Y26 respectively have the patterns to be transferred to the tabs Y9 to Y16 on the glass substrate P.

The width of the display section 2a is the total length of three tabs Y24 to Y26 in the X direction, and in the Y direction, the display section 2a has a length corresponding to about one half in the −Y direction including a little in the +Y direction from the division line H1, of the pattern which the display section 2 transfers, as with the above described tabs X11 and X12. The shading zone 23 is formed on the periphery of three sides of the circuit pattern 1a, excluding the side in the +Y direction.

Moreover, in the reticle B, as shown in FIG. 1B, a division line V15 is set so as to extend in the Y direction, passing through the center of the tab Y24 located at the left end, and a division line V18 is set so as to extend in the Y direction, passing through the center of the tab Y26 located at the right end. Furthermore, a division line V16 is set so as to extend in the Y direction, passing between the left end tab Y24 and the center tab Y25, and a division line V17 is set so as to extend in the Y direction, passing between the right end tab Y26 and the center tab Y22. Similarly, a division line H12 is set so as to extend in the X direction, at a position corresponding to the division line H1.

The circuit pattern 1a of the reticle B is divided into a common pattern KP and non-common patterns HP1 and HP2 different from the common pattern KP, at the time of exposure onto the adjacent two divided patterns. The common pattern KP is set so as to be transferred commonly to both these divided patterns. The non-common patterns HP1 and HP2 are continuous with the common pattern KP, and are set so as to be formed with the common pattern KP therebetween. Then, at the time of exposure of each divided pattern, the common pattern KP and at least a part of the non-common patterns HP1 and HP2 are selected.

A procedure for transferring the circuit pattern 1 onto the glass substrate P by using the exposure apparatus and the mask having the above described construction will now be described. Here, the explanation will be made, assuming that the divided patterns A1 to A4, and B1 to B4 are sequentially transferred.

Exposure data such as reference coordinate position, size or the like for the divided areas where the previously divided patterns A1 to A4 and B1 to B4 are respectively divided and exposed, and data in which a side to be joined and exposed is specified in each divided area, are input to the exposure data setting section 21.

Figures 5A, 5B:
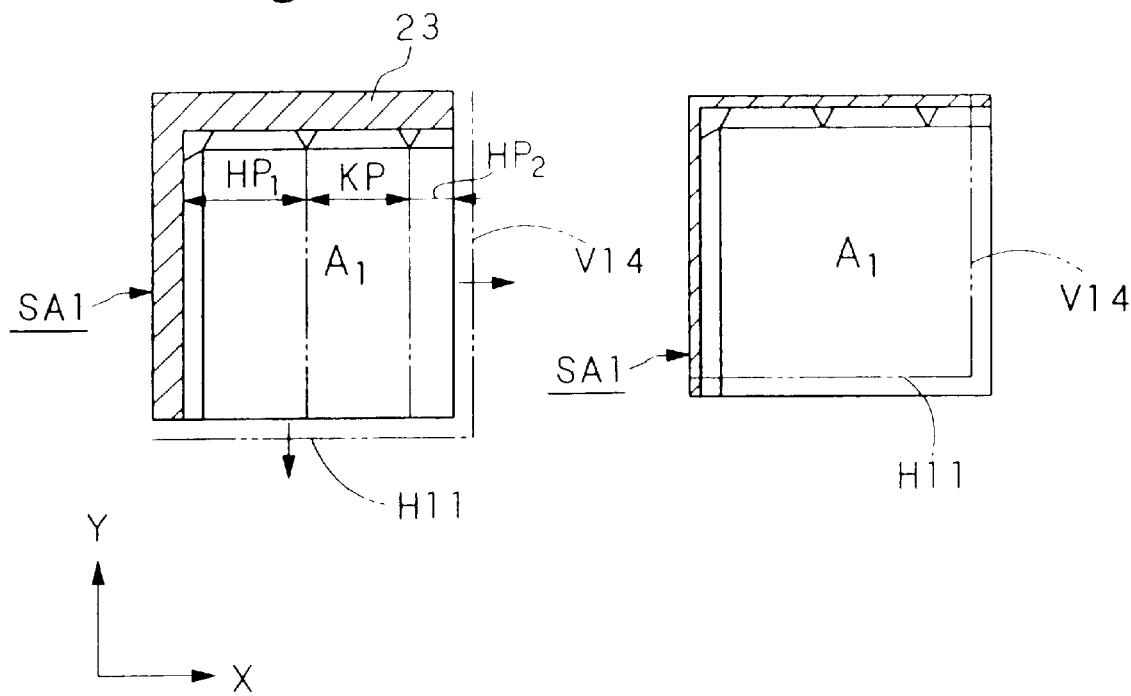
FIGS. 5A and 5B are views showing a first embodiment of the present invention, being plan views showing a pattern of a reticle in a first illumination area.

At first, once the reticle A is aligned and set on the reticle stage 10 by the reticle changing apparatus (not shown), the drive control apparatus 11 reads the data in the exposure data setting section 21, to drive the blind plates 17a and 17b of the reticle blind 17 via the drive mechanism 20. As a result, a rectangular illumination area (first illumination area) SA1 corresponding to the divided pattern A1 is set on the reticle A as a first pattern, as shown in FIG. 5B, corresponding to the opening S of the reticle blind 17. The divided pattern A1 comprises a common pattern KP, and part of non-common patterns HP1 and HP2.

Here, the division line V14 of the reticle A is set to the division line V1 on the glass substrate P. At the same time, the division line H11 is set to the division line H1 on the glass substrate P.

At this time, the right side (the side on the +X side) of the illumination area SA1 is set, corresponding to the overlapped width at the time of the pattern joining exposure, by offsetting toward the −X side with respect to the set division line V14. Similarly, the lower side (the side on the −Y side) of the illumination area SA1 is set, corresponding to the overlapped exposure width, by offsetting toward the +Y side with respect to the set division line H11. Moreover, the left side (the side on the −X side) and the upper side (the side on the +Y side) of the illumination area SA1 are set so as to be exposed with a width larger than the overlapped exposure width of the shading zone 23.

On the other hand, the drive control unit 11 drives the reticle blind 17, and simultaneously drives the substrate stage 9 via the drive mechanism 22. As a result, the substrate stage 9 shifts so that the glass substrate P is set to a position corresponding to the illumination area SA1 set by the reticle blind 17. When the substrate stage 9 shifts, the laser interferometer (not shown) shines the laser beam 19 toward the mobile mirror 9a on the substrate stage 9, to thereby measure the distance based on the interference between the reflected light and the incident light thereof, and accurately detect the position of the substrate stage 9 (that is, the glass substrate P).

When the reticle blind 17 and the substrate stage 9 are set to a predetermined position, as shown in FIG. 3, the exposure apparatus 5 focuses the beam B which is the illumination light from the mercury lamp 6 with the elliptic mirror 6a, so that the beam B enters the wavelength selection filter 15 from the reflection mirror 13, in response to the opening operation of the shutter 12. The beam B of only the wavelength necessary for the exposure which has passed through the wavelength selection filter 15 is adjusted to a uniform illuminance distribution by the fly eye integrator 16, and reaches the reticle blind 17.

The beam B passed through the opening S of the reticle blind 17 is reflected by the reflection mirror 14 and input to the condenser lens 18. An image of the opening S of the reticle blind 17 is imaged on the reticle A by the condenser lens 18, thus illuminating the illumination area SA1 of the reticle A corresponding to the opening S. The pattern image existing in the illumination area SA1 of the reticle A is imaged on the exposure area on the glass substrate P by the projection optical system 8. Hence, the divided pattern A1 is transferred to the exposure area on the glass substrate P corresponding to the illumination area SA1.

During the exposure, based on the instruction of the drive control unit 11, the blind plates 17a and 17b of the reticle blind 17 shift. As a result, as shown in FIG. 5B, the illumination area SA1 shifts by the width to be overlapped and exposed at a predetermined speed such that the right side thereof shifts toward the +X direction so as to go beyond the division line 14 and the lower side thereof shifts toward the −Y direction so as to go beyond the division line H11, respectively (that is, in FIGS. 5A and 5B, from the upper left side to the lower right side). Due to this shift of the right side and the lower side, in the exposure area on the glass substrate P, the exposure is effected in a state with the exposure energy quantity gradually decreasing at a certain ratio.

Subsequently, the divided pattern A2 is exposed as a second pattern. The divided pattern A2 comprises a common pattern KP and a part of a non-common pattern HP1.

Figures 6A, 6B:
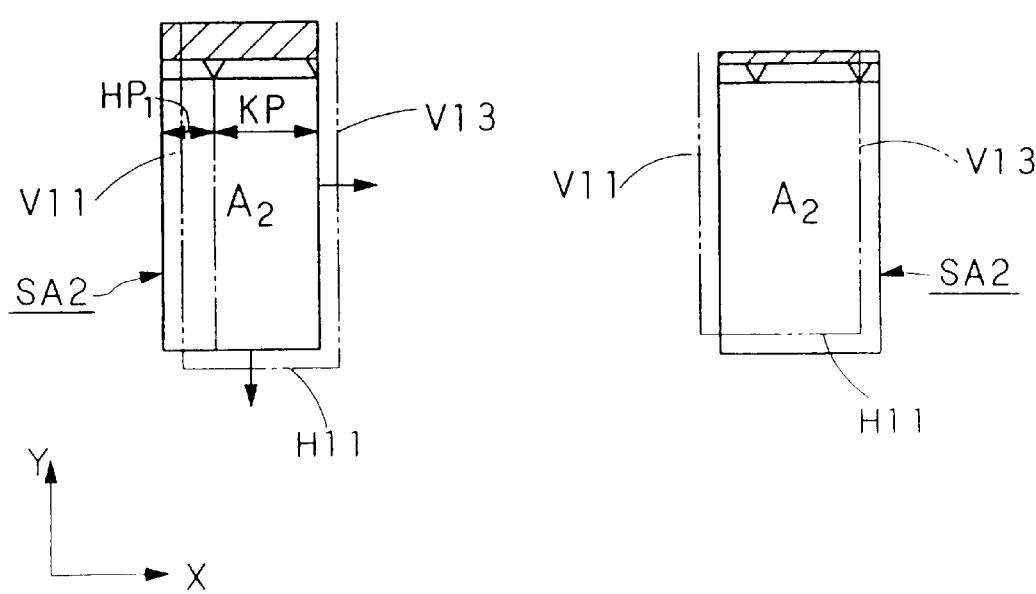
FIGS. 6A and 6B are views showing a first embodiment of the present invention, being plan views showing a pattern of a reticle in a second illumination area.

In the same manner as described above, under the control of the drive control unit 11, the blind plates 17a and 17b of the reticle blind 17, and the substrate stage 9 shift. As a result, a rectangular illumination area (second illumination area) SA2 corresponding to the divided pattern A2 is set on the reticle A as the second pattern, as shown in FIG. 6A, corresponding to the opening S of the reticle blind 17. Moreover, the substrate stage 9 shifts so that the glass substrate P is set to a position corresponding to the illumination area SA2 set by the reticle blind 17.

Here, the division line V13 of the reticle A is set to the division line V2 on the glass substrate P. Moreover, the division line V11 of the reticle A is set to the division line V1 on the glass substrate P. At the same time, the division line H11 is set to the division line H1 on the glass substrate P.

At this time, the right side of the illumination area SA2 is set corresponding to the overlapped exposure width, by offsetting toward the −X side with respect to the set division line V13. Similarly, the lower side of the illumination area SA2 is set corresponding to the overlapped exposure width, by offsetting toward the +Y side with respect to the set division line H11. Moreover, the left side thereof is set, beyond the division line V11 so as to correspond with the position of the right side set by the illumination area SA1 before exposure shown in FIG. 5A. The upper side of the illumination area SA2 is set so as to be exposed with a width larger than the overlapped exposure width of the shading zone 23, as described above.

By the setting of the illumination area SA2, then as shown in FIG. 1A, in the circuit pattern 1a of the reticle A, a pattern between the division lines V11 and V13 is set to be a common pattern KP for the divided patterns A1 and A2 serving as the first and second patterns. Moreover, a pattern on the −X side from the division line V11 and a pattern between the division lines V13 and V14 are selected as non-common patterns HP, HP with the common pattern KP therebetween.

When the exposure processing is performed in the same manner as described above, the illumination area SA2 of the reticle A corresponding to the opening S of the reticle blind 17 is illuminated. The pattern image existing in the illumination area SA2 of the reticle A is imaged on the glass substrate P by the projection optical system 8. Hence, the divided pattern A2 is transferred to the exposure area on the glass substrate P corresponding to the illumination area SA2. Here, at the time of exposure processing, based on the instruction of the drive control unit 11, the blind plates 17a and 17b of the reticle blind 17 shift. As a result, as shown in FIG. 6B, the illumination area SA2 shifts by the width to be overlapped and exposed at a predetermined speed such that the right side thereof shifts toward the +X direction and the lower side thereof shifts toward the −Y direction, respectively (that is, in FIGS. 6A and 6B, from the upper left side to the lower right side). As a result, the abutting division patterns A1 and A2 are joined and exposed.

Figure 7A:
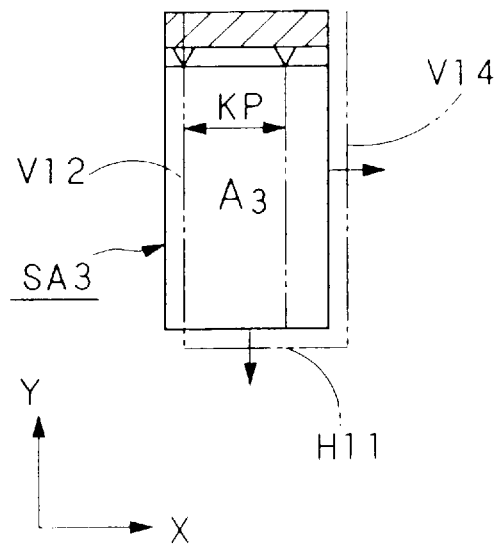
FIGS. 7A and 7B are plan views showing a pattern of a reticle in other illumination areas.
Figure 7B:
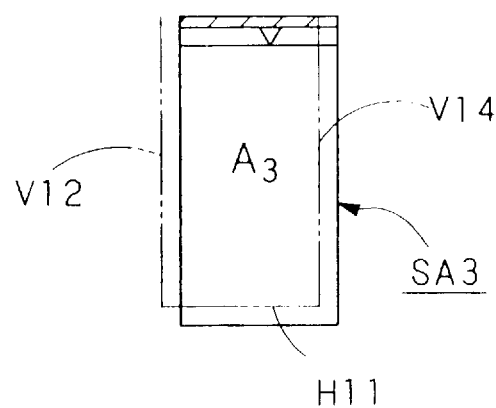
Figure 8A:
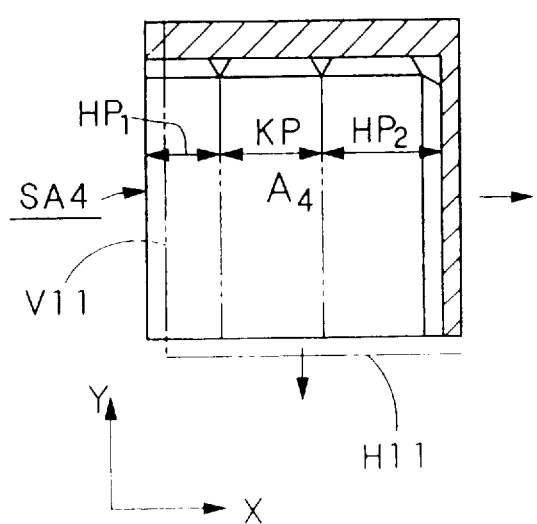
FIGS. 8A and 8B are views showing a pattern of a reticle in other illumination areas.
Figure 8B:
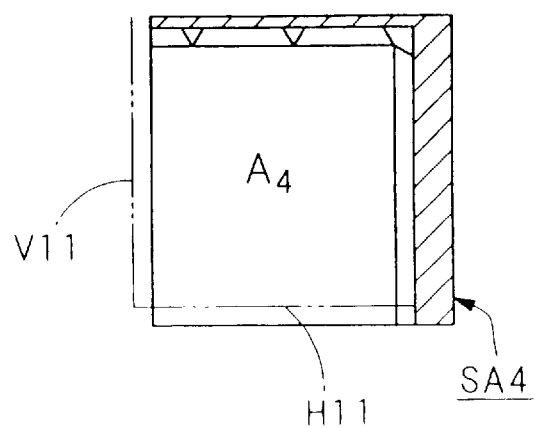

Thereafter, by the same procedure as described above, the divided pattern A3 set as shown in FIGS. 7A and 7B, and the divided pattern A4 set as shown in FIGS. 8A and 8B are sequentially transferred so that the abutting divided patterns are joined and exposed in the exposure area on the glass substrate P corresponding to respective illumination areas SA3 and SA4, by shifting the illumination areas SA3 and SA4 corresponding to respective divided patterns A3 and A4 from the +Y and −X sides to the −Y and +X sides, respectively (that is, in FIG. 7 and FIG. 8, from the upper left side to the lower right side).

After the transfer of the divided patterns A1 to A4 have been completed, the reticle A on the reticle stage 10 is changed to a reticle B shown in FIG. 1B, by the reticle changing apparatus. The reticle B is one formed symmetrically to the reticle A in the Y direction. With the reticle B also, by sequentially transferring the divided patterns B1 to B4 while joining and exposing by the same procedure as for the reticle A, the circuit pattern 1 is transferred to the glass substrate P.

Figure 9A:
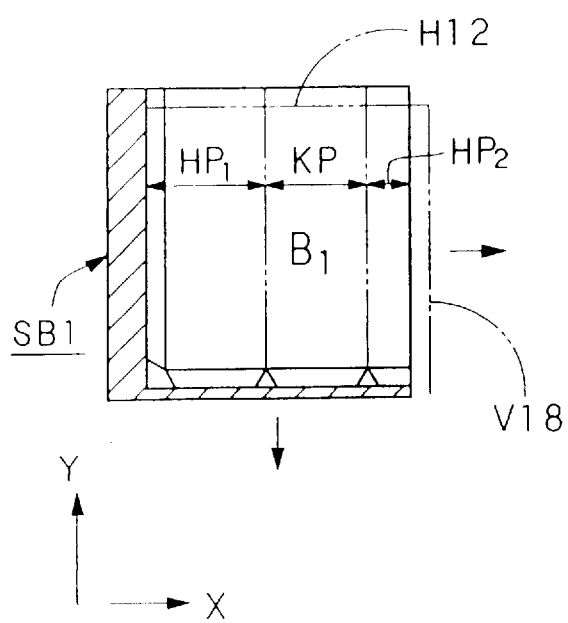
FIGS. 9A and 9B are views showing a first embodiment of the present invention, being plan views showing a pattern of another reticle in other illumination areas.

More specifically, at first a rectangular illumination area SB1 corresponding to the divided pattern B1 is set on the reticle B, as shown in FIG. 9A, corresponding to the opening S of the blind plates 17a and 17b of the reticle blind 17. This divided pattern B1 comprises a common pattern KP, and part of non-common patterns HP1 and HP2. Here, the division line V18 of the reticle B is set to the division line V1 on the glass substrate P. At the same time, the division line H12 is set to the division line H1 on the glass substrate P.

At this time, the right side of the illumination area SB1 (the side on the +X side) is set corresponding to the overlapped width at the time of pattern joining exposure, by offsetting toward the −X side with respect to the set division line V18. Similarly, the upper side of the illumination area SB1 (the side on the +Y side) is set corresponding to the overlapped exposure width, by offsetting toward the +Y side with respect to the set division line H12. Moreover, the left side (the side on the −X side) and the lower side (the side on the −Y side) thereof are set so as to be exposed with a width larger than the overlapped exposure width of the shading zone 23, as described above.

Figure 9B:
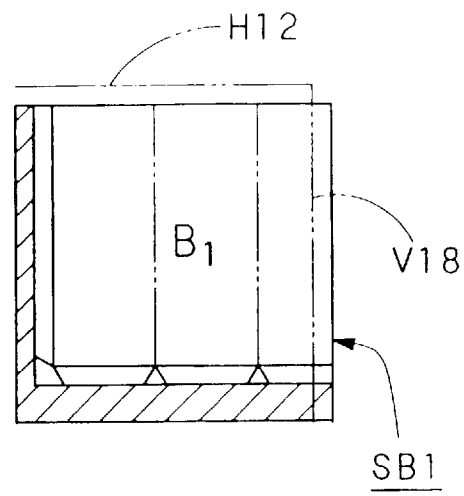

Then, after the substrate stage 9 has been shifted to a position where the glass substrate P corresponds to the illumination area SB1, the exposure processing is performed in the same manner as described above to thereby illuminate the illumination area SB1. The pattern image existing in the illumination area SB1 of the reticle B is imaged on the glass substrate P by the projection optical system 8. Hence, the divided pattern B1 is transferred to the exposure area on the glass substrate P corresponding to the illumination area SB1. Here, at the time of exposure processing, based on the instruction of the drive control unit 11, the blind plates 17a and 17b of the reticle blind 17 shift. As a result, as shown in FIG. 9B, the illumination area SB1 shifts by the width to be overlapped and exposed at a predetermined speed such that the right side thereof shifts toward the +X direction and the lower side thereof shifts toward the −Y direction, respectively (that is, in FIGS. 9A and 9B, from the upper left side to the lower right side). As a result, the abutting division patterns A1 and B1 are joined and exposed.

Figure 10A:
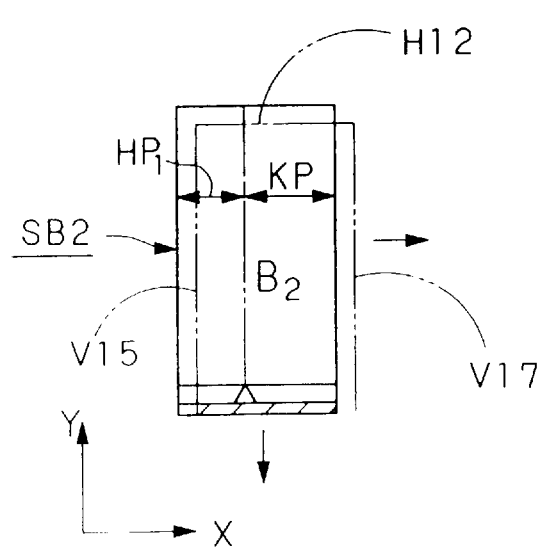
FIG. 10A and 10B are plan views showing a pattern of a reticle in other illumination areas.
Figure 10B:
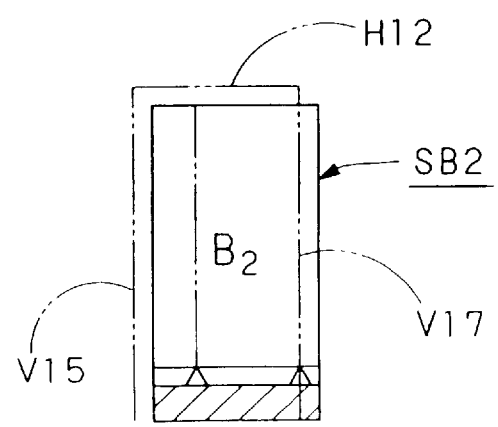
Figure 11A:
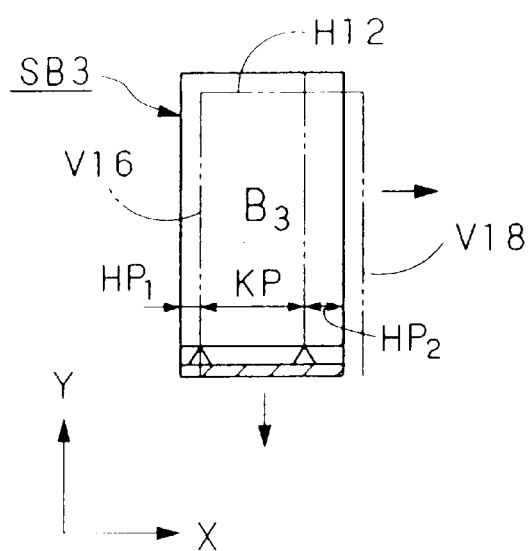
FIGS. 11A and 11B are plan views showing a pattern of a reticle in other illumination areas.
Figure 11B:
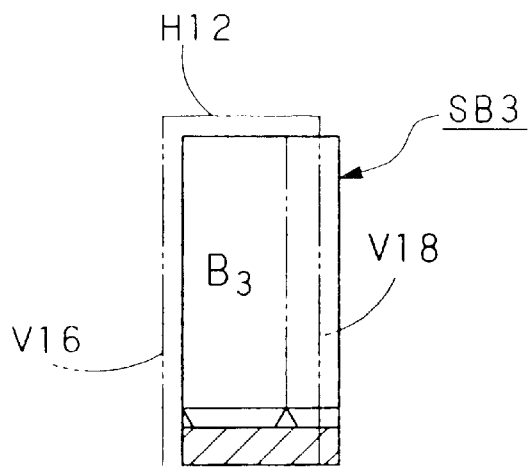
Figure 12A:
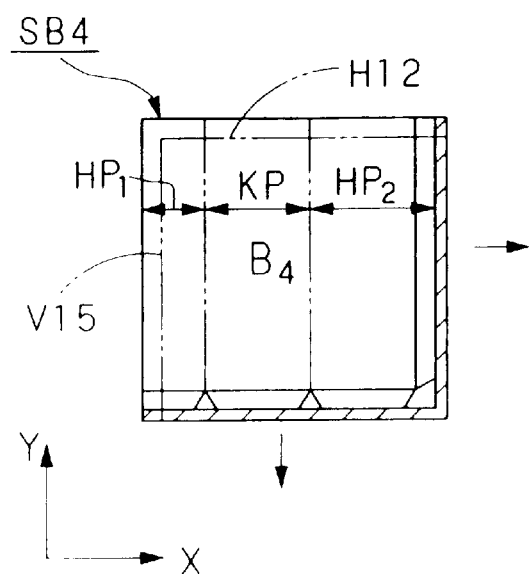
FIGS. 12A and 12B are plan views showing a pattern of a reticle in other illumination areas.
Figure 12B:
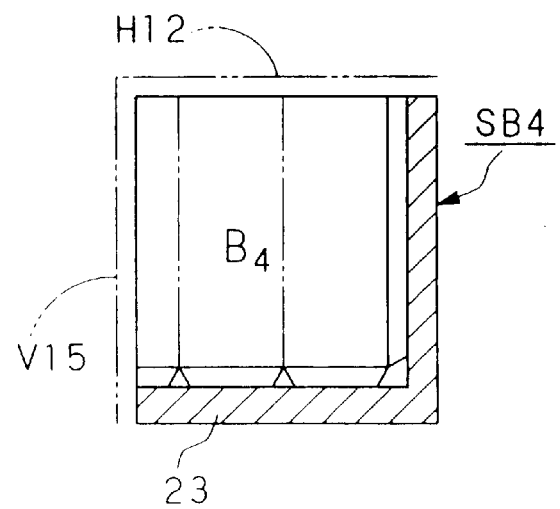

Thereafter, by the same procedure as described above, the divided pattern B2 set as shown in FIGS. 10A and 10B, the divided pattern B3 set as shown in FIGS. 11A and 11B, and the divided pattern B4 set as shown in FIGS. 12A and 12B are sequentially transferred so that the abutting divided patterns are joined and exposed in the exposure area on the glass substrate P corresponding to respective illumination areas SB2 to SB4, by shifting the illumination areas SB2 to SB4 corresponding to respective divided patterns B2 to B4 from the +Y and −X sides to the −Y and +X sides, respectively (that is, in FIGS. 10 and 12, from the upper left side to the lower right side).

Here, when the exposure area is not overlapped by only one side, but is arranged in a rectangular shape so that respective two or more sides are overlapped, for example, as in the divided patterns A1, A2, B1 and B2, then with the above described exposure method, the intersection portion K1 of these four exposure areas are overlapped and exposed by at least three exposure areas, depending upon the shift direction of the illumination area, as shown in FIG. 2. The energy quantity exposed on the intersection portion K1 when the illumination area is shifted from the +Y and −X side to the −Y and +X side (that is, in FIG. 2, from the upper left side to the lower right side) as described above will now be described, with reference to FIGS. 13 to 18.

Figure 13:
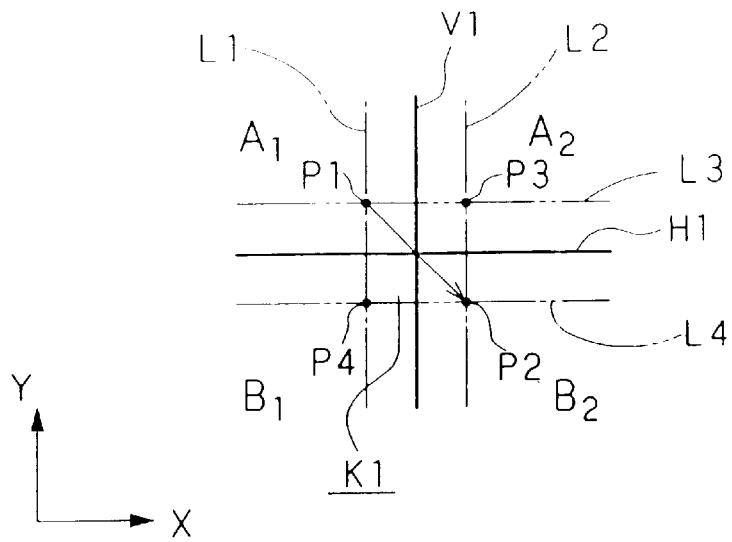
FIG. 13 is a diagram explaining an intersection portion where the exposure areas intersect.
Figure 14:
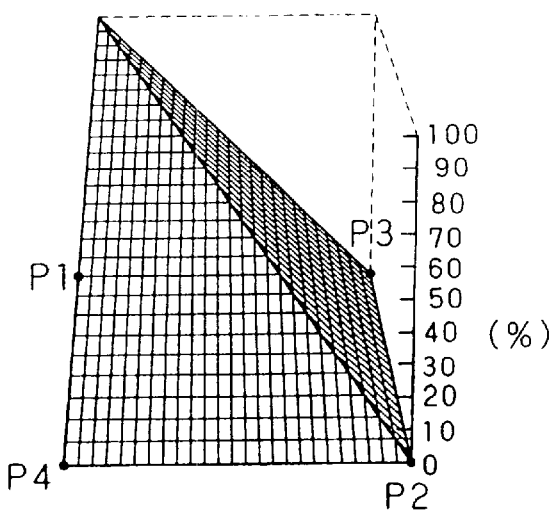
FIG. 14 to FIG. 18 are exposure quantity distribution diagrams showing the distribution of the exposure quantity in the intersection portion.

As shown in FIG. 13, in the case where respective illumination areas SA1~SA2 and SB1~SB2 are shifted respectively between the lines L1 and L2 and the lines L3 and 1A, the intersection portion K1 becomes a rectangular area surrounded by the lines L1 to L4. Moreover, if the node of lines L1 and L3 is designated as P1, the node of lines L2 and L4 is designated as P2, the node of lines L2 and L3 is designated as P3 and the node of lines L1 and L4 is designated as P4, the end point of the illumination area SA1 will shift from the node P1 to the node P2, that is, in the diagonal direction of the rectangularly arranged exposure area, when the divided pattern A1 is exposed. At this time, if it is assumed that the exposure quantity irradiated by one exposure to an area which is not overlapped is 100%, then as shown in FIG. 14, the intersection K1 will show the exposure quantity distribution in a quadrangular pyramid shape wherein the node P1 has 100% exposure quantity and the nodes P2 to P4 have 0% exposure quantity.

Figure 15:
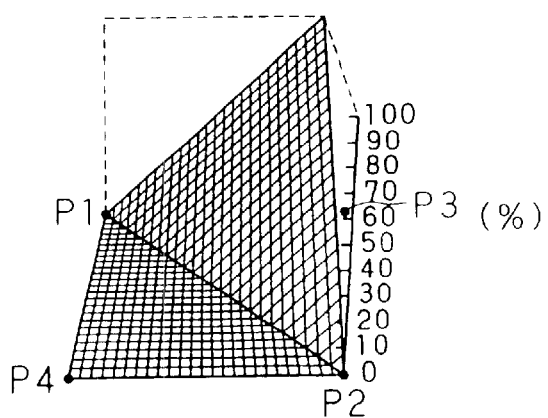
Figure 16:
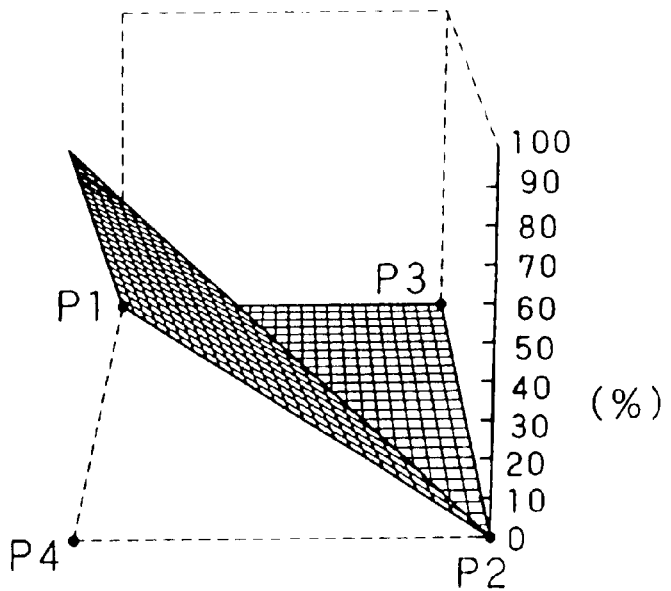
Figure 17:
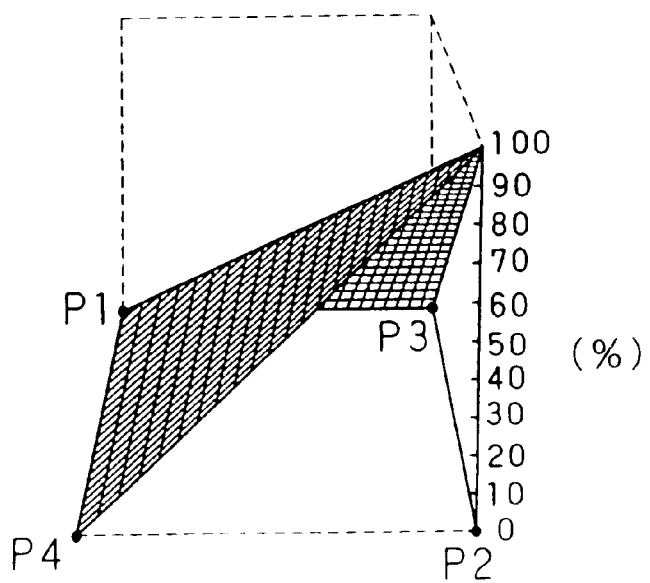

Furthermore, when the divided pattern A2 is exposed, the end point of the illumination area SA2 shifts from the node P1 to the node P2, that is, in the diagonal direction, but the triangular area surrounded by the nodes P1, P2 and P4 is not exposed. Therefore, the intersection portion K1 will show the exposure quantity distribution in a triangular pyramid shape wherein the node P3 has 100% exposure quantity and the nodes P1 and P2 have 0% exposure quantity, as shown in FIG. 15. Similarly, when the divided pattern B1 is exposed, the end point of the illumination area SB1 shifts from the node P1 to the node P2, that is, in the diagonal direction, but the triangular area surrounded by the nodes P1, P2 and P3 is not exposed. Therefore, the intersection portion K1 will show the exposure quantity distribution in a triangular pyramid shape wherein the node P4 has 100% exposure quantity and the nodes P1 and P2 have 0% exposure quantity, as shown in FIG. 16. Moreover, when the divided pattern B2 is exposed, the end point of the illumination area SB2 shifts from the node P1 to the node P2, that is, in the diagonal direction, and the intersection portion K1 will show the exposure quantity distribution in a quadrangular pyramid shape wherein the node P2 has 100% exposure quantity and the nodes P1, P3 and P4 have 0% exposure quantity, as shown in FIG. 17.

Figure 18:
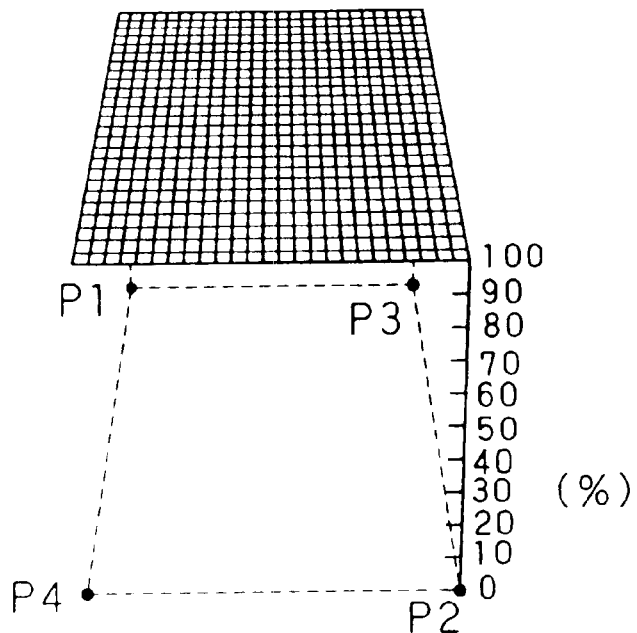

Then, the exposure quantity irradiated to the intersection portion K1 by means of the above described four exposures will become 100% in all areas, as shown in FIG. 18, becoming the same as the other exposure areas. Since with the other intersection portions also the illumination areas are shifted as with the intersection portion K1, each intersection portion is exposed with 100% exposure quantity.

To make the exposure quantity in the intersection portion 100%, it is not always necessary to shift the end point of the illumination area from the node P1 to the node P2, provided that four exposures are made so that the intersection portion K1 shows two exposure quantity distributions in a quadrangular pyramid shape and two exposure quantity distributions in a triangular pyramid shape. In other words, a plurality of pairs (two pairs in this embodiment) are formed by two exposure areas whose one side is overlapped (two abutting exposure areas), among four exposure areas arranged in a rectangular shape so that respective two sides are overlapped, and if the illumination area corresponding to each exposure area is shifted along the same direction for each pair, the intersection portion K1 for each pair is exposed with the exposure quantity distribution in a quadrangular pyramid shape and a triangular pyramid shape. Hence, the exposure quantity distribution combining the two pairs becomes two quadrangular pyramid shapes and two triangular pyramid shapes, to thereby effect the exposure with 100% exposure quantity.

Therefore, in the above described diagonal direction, the shift direction of the illumination area may be different for each pair, and for example, if a pair is constituted by the exposure area corresponding to the divided patterns A1 and A2, and a pair is constituted by the exposure area corresponding to the divided patterns B1 and B2, the end points of the illumination areas SA1 and SA2 corresponding to the divided patterns A1 and A2 may be shifted from the node P1 to the node P2, respectively, and the end points of the illumination areas SB1 and SB2 corresponding to the divided patterns B1 and B2 may be shifted from the node P3 to the node P4, respectively, in the diagonal direction.

In this case, for each pair, there is no need for shifting the pair in the same direction as long as it is shifted along the diagonal direction. For example, the end point of the illumination area SA1 may be shifted from the node P1 to the node P2, and the end point of the illumination area SA2 may be shifted from the node P2 to the node P1. Similarly, the end point of the illumination area SB1 may be shifted from the node P3 to the node P4, and the end point of the illumination area SB2 may be shifted from the node P4 to the node P3. Moreover, the construction of each pair is not limited to the above described example, and if one side of the exposure area is overlapped, a pair may be formed by exposure areas corresponding to the divided patterns A1 and B1, and another pair may be formed by exposure areas corresponding to the divided patterns A2 and B2.

The above described pattern joining exposure is constructed such that the illumination area is shifted by the blind plates 17a and 17b having the shading portion 24 and the transmission portion 25. Next, a method for effecting the pattern joining exposure by using the reticle blind 17 shown in FIG. 4B will be described. As shown in this figure, the reticle blind 17 comprises blind plates 17c and 17d formed from rectangular glass materials arranged so that a conjugated plane of the reticle R is disposed therebetween. The respective blind plates 17c and 17d are provided with a shading portion 24, a transmission portion 25 and a light attenuation portion 26 arranged therebetween.

The light attenuation portion 26 is vacuum deposited with chromium in dot form having a size not larger than the limit of resolution of the exposure apparatus 5. The density of this chromium film in dot form is set so as to become gradually larger from the transmission portion 25 toward the shading portion 24, and hence the transmission of the beam B becomes gradually lower (changes). Moreover, the width of the light attenuation portion 26 is set to be the overlapped length of the exposure areas abutting with each other in the Y direction, that is, to be the same as the distance between the lines L3 and L4. The light attenuation portion 26 is disposed on the upper side of the transmission portion 25 in the blind plate 17c, and on the lower side of the transmission portion 25 in the blind plate 17d. The blind plates 17c and 17d of the reticle blind 17 are shifted to combine each transmission portion 25, to thereby form the opening S depending on the extent that the transmission portions 25 overlap, and to form in the illumination area set by the opening S, a light attenuation area on a side corresponding to the light attenuation portion 26.

Figure 20A:
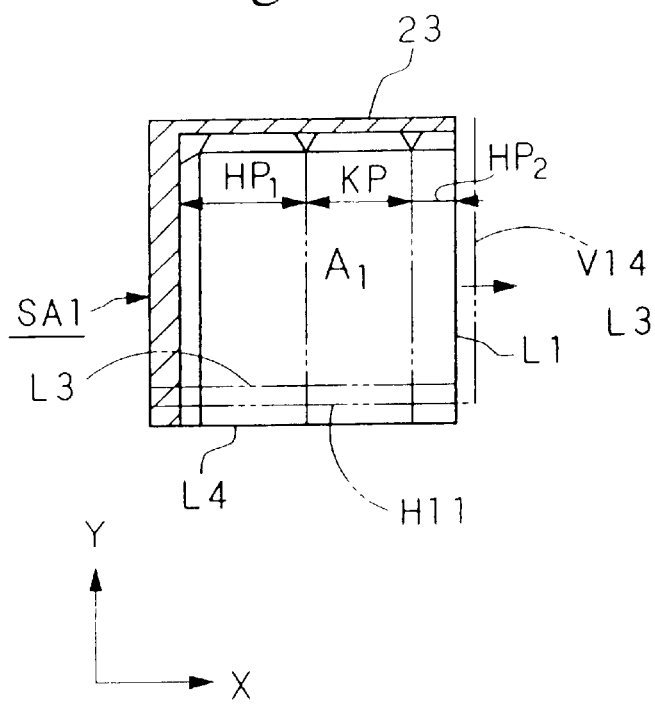
FIGS. 20A and 20B are plan views showing a pattern of a reticle in an illumination area set by a blind plate having a light attenuation portion.

When the exposure is effected using the blind plates 17c and 17d, at first on the reticle A, a rectangular illumination area (a first illumination area) SA1 corresponding to the divided pattern A1 is set, as shown in FIG. 20A, corresponding to the opening S of the reticle blind 17. This divided pattern A1 comprises a common pattern KP, a non-common pattern HP1 and a part of a non-common pattern HP2. Here, the division line V14 of the reticle A is set to the division line V1 on the glass substrate P. At the same time, the division line H11 is set to the division line H1 on the glass substrate P.

At this time, the right side of the illumination area SA1 (the side on the +X side) is set corresponding to the overlapped width at the time of pattern joining exposure, by offsetting toward the −X side with respect to the set division line V14, so as to correspond with the line L1 on the glass substrate P. Similarly, the lower side of the illumination area SA1 (the side on the −Y side) is set corresponding to the overlapped exposure width, by offsetting toward the −Y side with respect to the set division line H11, so as to correspond with the line 1A. At this time, the shading portion 26 of the blind plate 17d sets an illumination area corresponding to the exposure area surrounded by the lines L3, L1 and L4 on the glass substrate P as a light attenuation area, in the lower side of the illumination area SA1. Moreover, the left side (the side on the −X side) of the illumination area SA1 is set so as to be exposed with a width larger than the overlapped exposure width of the shading zone 23.

Figure 20B:
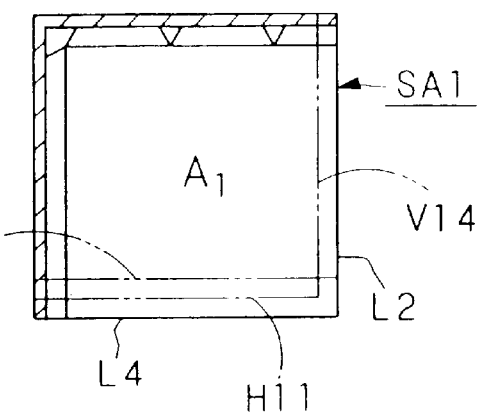

Then, after the substrate stage 9 has been shifted to a position where the glass substrate P corresponds to the illumination area SA1, the exposure processing is performed in the same manner as described above to thereby illuminate the illumination area SA1. The pattern image existing in the illumination area SA1 of the reticle A is imaged on the glass substrate P by the projection optical system 8. Hence, the divided pattern A1 is transferred to the exposure area on the glass substrate P corresponding to the illumination area SA1. At the time of exposure processing, based on the instruction of the drive control unit 11, the blind plates 17c and 17d of the reticle blind 17 shift. As a result, as shown in FIG. 20B, the illumination area SA1 shifts at a predetermined speed toward the +X direction (that is, in FIGS. 22A and 22B, from the left to the right) along the lengthwise direction of the light attenuation portion 26 so that the right side thereof corresponds with the line L2 on the glass substrate P.

Subsequently, the divided pattern A2 is exposed as a second pattern. The divided pattern A2 comprises the common pattern KP and a part of the non-common pattern HP1.

Figure 21A:
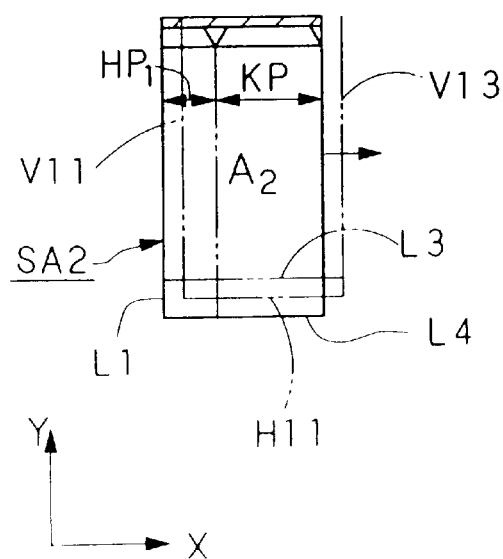
FIGS. 21A and 21B are plan views showing a pattern of a reticle in other illumination areas.

In the same manner as described above, under the control of the drive control unit 11, the blind plates 17c and 17d of the reticle blind 17, and the substrate stage 9 shift. As a result, a rectangular illumination area (second illumination area) SA2 corresponding to the divided pattern A2 is set on the reticle A as the second pattern, as shown in FIG. 21A, corresponding to the opening S of the reticle blind 17. Moreover, the substrate stage 9 shifts so that the glass substrate P is set to a position corresponding to the illumination area SA2 set by the reticle blind 17. Here, the division line V13 of the reticle A is set to the division line V2 on the glass substrate P. The division line V11 of the reticle A is set to the division line V1 on the glass substrate P. At the same time, the division line H11 is set to the division line H1 on the glass substrate P.

At this time, the right side of the illumination area SA2 is set corresponding to the overlapped exposure width, by offsetting toward the −X side with respect to the set division line V13. Similarly, the lower side of the illumination area SA2 is set corresponding to the overlapped exposure width, by offsetting toward the −Y side with respect to the set division line H11, so as to correspond with the line L4 on the glass substrate P. Moreover, the left side thereof is set beyond the division line V11 so as to correspond with the position of the right side set by the illumination area SA1 before exposure shown in FIG. 20A (that is, the line L1 on the glass substrate P). At this time, the shading portion 26 of the blind plate 17d sets an illumination area corresponding to the exposure area surrounded by the lines L3, L1 and L4 on the glass substrate P as a light attenuation area, in the lower side of the illumination area SA2. The upper side of the illumination area SA2 is set so that the shading zone 23 is exposed, as described above.

Figure 21B:
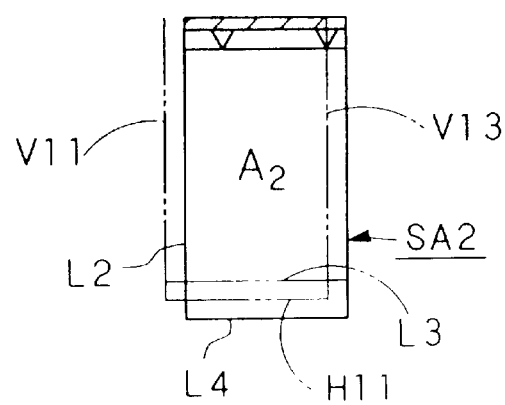

When the exposure processing is performed in the same manner as described above, the illumination area SA2 is illuminated, and the pattern image existing in the illumination area SA2 of the reticle A is imaged on the glass substrate P by the projection optical system 8. Hence, the divided pattern A2 is transferred to the exposure area on the glass substrate P corresponding to the illumination area SA2. At the time of exposure processing, based on the instruction of the drive control unit 11, the blind plates 17c and 17d of the reticle blind 17 shift. As a result, as shown in FIG. 21B, the illumination area SA2 shifts at a predetermined speed toward the +X direction (that is, in FIGS. 21A and 21B, from the left to the right) along the lengthwise direction of the light attenuation portion 26 so that the left side thereof corresponds with the line L2 on the glass substrate P. Thereafter, by the same procedure as for the divided patterns A1 and A2, the divided patterns A3 and A4 are sequentially transferred onto the glass substrate P, while shifting each illumination area toward the +X direction.

Figure 22A:
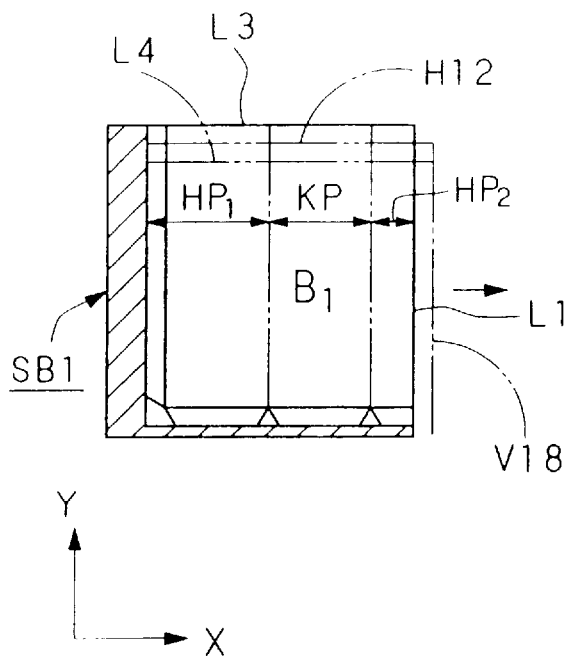
FIGS. 22A and 22B are plan views showing a pattern of a reticle in other illumination areas.

Then, the reticle A is changed to the reticle B, and in the reticle B, a rectangular illumination area SB1 corresponding to the divided pattern B1 is set, as shown in FIG. 22A, corresponding to the opening S of the reticle blind 17. This divided pattern B1 comprises a common pattern KP, a non-common pattern HP1 and a part of a non-common pattern HP2. Here, the division line V18 of the reticle B is set to the division line V1 on the glass substrate P. At the same time, the division line H12 is set to the division line H1 on the glass substrate P. At this time, the right side of the illumination area SB1 (the side on the +X side) is set corresponding to the overlapped width at the time of pattern joining exposure, by offsetting toward the −X side with respect to the set division line V18, so as to correspond with the line L1 on the glass substrate P. Similarly, the upper side of the illumination area SB1 (the side on the +Y side) is set corresponding to the overlapped exposure width, by offsetting toward the +Y side with respect to the set division line H12, so as to correspond with the line 13. At this time, the shading portion 26 of the blind plate 17c sets an illumination area corresponding to the exposure area surrounded by the lines 13, L1 and 1A on the glass substrate P as a light attenuation area, in the upper side of the illumination area SB1. Moreover, the left side (the side on the −X side) of the illumination area SB1 is set so as to be exposed with a width larger than the overlapped exposure width of the shading zone 23.

Figure 22B:
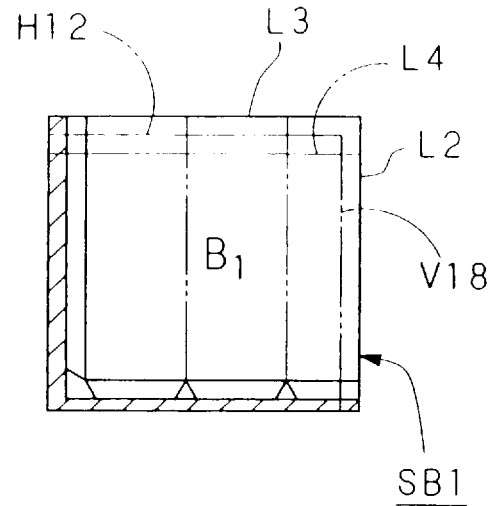

Then, after the substrate stage 9 has been shifted to a position where the substrate stage 9 corresponds to the illumination area SB1, the exposure processing is performed in the same manner as described above to thereby illuminate the illumination area SB1. The pattern image existing in the illumination area SB1 of the reticle B is imaged on the glass substrate P by the projection optical system 8. Hence, the divided pattern B1 is transferred to the exposure area on the glass substrate P corresponding to the illumination area SB1. At the time of exposure processing, based on the instruction of the drive control unit 11, the blind plates 17c and 17d of the reticle blind 17 shift. As a result, as shown in FIG. 22B, the illumination area SB1 shifts at a predetermined speed toward the +X direction (that is, in FIGS. 22A and 22B, from the left to the right) along the lengthwise direction of the light attenuation portion 26 so that the right side thereof corresponds with the line L2 on the glass substrate P.

Figure 23A:
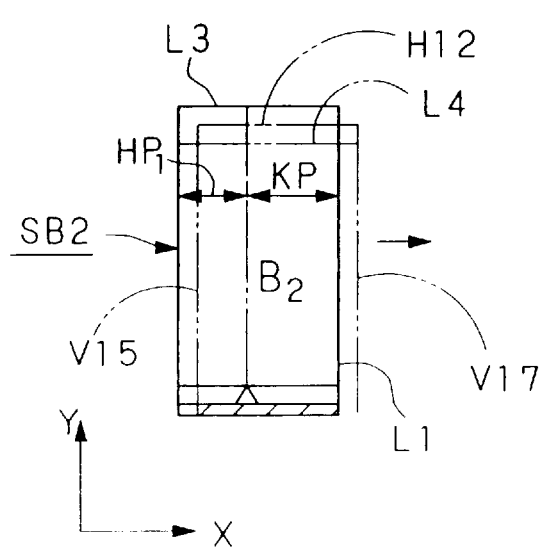
FIGS. 23A and 23B are plan views showing a pattern of a reticle in other illumination areas.

Subsequently, in the same manner as described above, under the control of the drive control unit 11, the blind plates 17c and 17d of the reticle blind 17, and the substrate stage 9 shift. As a result, a rectangular illumination area (second illumination area) SB2 corresponding to the divided pattern B2 is set on the reticle B as the second pattern, as shown in FIG. 23A, corresponding to the opening S of the reticle blind 17. Moreover, the substrate stage 9 shifts so that glass substrate P is set to a position corresponding to the illumination area SB2 set by the reticle blind 17. Here, the division line V17 of the reticle B is set to the division line V2 on the glass substrate P. The division line V15 of the reticle B is set to the division line V1 on the glass substrate P. At the same time, the division line H12 is set to the division line H1 on the glass substrate P.

At this time, the right side of the illumination area SB2 is set corresponding to the overlapped exposure width, by offsetting toward the −X side with respect to the set division line V17. Similarly, the upper side of the illumination area SB2 is set corresponding to the overlapped exposure width, by offsetting toward the +Y side with respect to the set division line H12, so as to correspond with the line L3 on the glass substrate P. Moreover, the left side thereof is set beyond the division line V15 so as to correspond with the position of the right side set by the illumination area SB1 before exposure shown in FIG. 22A (that is, the line L1 on the glass substrate P). At this time, the shading portion 26 of the blind plate 17c sets an illumination area corresponding to the exposure area surrounded by the lines L3, L1 and L4 on the glass substrate P as a light attenuation area, in the upper side of the illumination area SB2. The lower side of the illumination area SB2 is set so that the shading zone 23 is exposed, as described above.

Figure 23B:
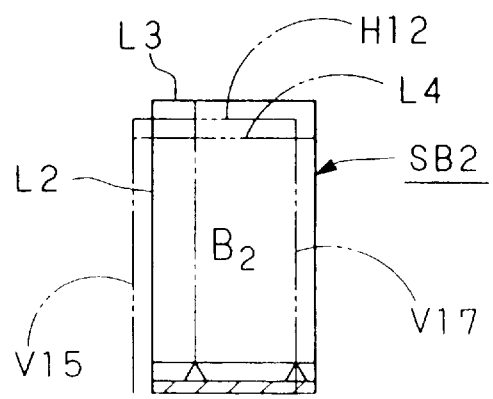

When the exposure processing is performed in the same manner as described above, the divided pattern B2 is transferred to the exposure area on the glass substrate P corresponding to the illumination area SB2. At the time of exposure processing, based on the instruction of the drive control unit 11, the blind plates 17c and 17d of the reticle blind 17 shift. As a result, as shown in FIG. 23B, the illumination area SB2 shifts at a predetermined speed toward the +X direction (that is, in FIGS. 23A and 23B, from the left to the right) along the lengthwise direction of the light attenuation portion 26 so that the left side thereof corresponds with the line 12 on the glass substrate P. Thereafter, by the same procedure as for the divided patterns B1 and B2, the divided patterns B3 and B4 are sequentially transferred onto the glass substrate P, while shifting each illumination area toward the +X direction.

Here, giving attention to the exposure area where of the exposure areas on the glass substrate P, the divided patterns A1 to A2 and B1 to B2 are arranged in a rectangular shape in the exposure area on the +Y side from the line 13 overlapped at the time of transferring the divided patterns A1 and A2, the exposure is effected with an exposure quantity gradually decreasing from 100% to 0%, with progressing from the line L1 to the line L2 at the time of transferring the divided pattern A1, and with an exposure quantity gradually increasing from 0% to 100%, with progressing from the line L1 to the line L2 at the time of transferring the divided pattern A2. Therefore, in an exposure area where those divided patterns are overlapped, overlap exposure is effected so that those divided patterns are exposed with 100% exposure quantity, as in the exposure area where overlap exposure is not effected. This happens similarly on the −Y side from the line L4 overlapped at the time of transferring the divided patterns B1 and B2.

Moreover, in the exposure area on the −X side from the line L1 overlapped at the time of transferring the divided patterns A1 and B1, the exposure is effected with an exposure quantity gradually decreasing from 100% to 0%, with progressing from the line L3 to the line L4 at the time of transferring the divided pattern A1, and with an exposure quantity gradually increasing from 0% to 100%, with progressing from the line L3 to the line L4 at the time of transferring the divided pattern B1. Therefore, in an exposure area where those divided patterns are overlapped, overlap exposure is effected so that those divided patterns are exposed with 100% exposure quantity, as in the exposure area where overlap exposure is not effected. This happens similarly on the +X side from the line L2 overlapped at the time of transferring the divided patterns A2 and B2.

Figure 19:
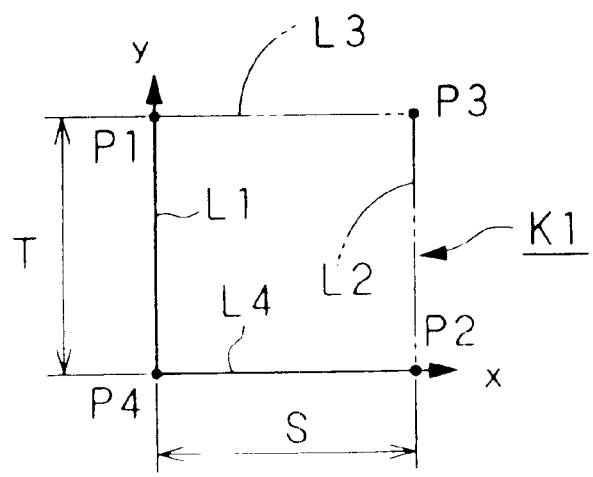
FIG. 19 is a diagram for explaining the intersection portion where the exposure areas intersect.

On the other hand, as shown in FIG. 19, in the intersection portion K1 of the exposure area where these divided patterns A1 to A2 and B1 to B2 are transferred, that is, in a rectangular area surrounded by the lines L1 to L4, if as described above, the node between the lines L1 and L3 is designated as P1, the node between the lines L2 and 1A is designated as P2, the node between the lines L2 and L3 is designated as P3 and the node between the lines L1 and L4 is designated as P4, and the distance between the lines L1 and L2 is designated as S, and the distance between the lines L3 and 1A is designated as T, and an XY coordinate system designating the node P4 as an origin is set, then the exposure quantity D1 (%) at the time of transferring the divided pattern A1 is determined by the following expression:

$$D1\ (\%) = (100 \times y/T) \times (1 - x/S) \tag{1}$$

Moreover the exposure quantity D2 (%) at the time of transferring the divided pattern A2 is determined by the following expression:

$$D2\ (\%) = (100 \times y/T) \times (x/S) \tag{2}$$

Moreover the exposure quantity D3 (%) at the time of transferring the divided pattern B1 is determined by the following expression:

$$D3\ (\%) = 100 \times (1 - y/T) \times (1 - x/S) \tag{3}$$

Moreover the exposure quantity D4 (%) at the time of transferring the divided pattern B2 is determined by the following expression:

$$D4\ (\%) = 100 \times (1 - y/T) \times (x/S) \tag{4}$$

Then, the exposure quantity D in the intersection portion K1 becomes the sum of the exposure quantities D1 to D4 determined by the above expressions (1) to (4):

$$D\ (\%) = D1 + D2 + D3 + D4 = 100.$$

As described above, the exposure quantity in the intersection portion K1 becomes 100%, and by exposing the glass substrate P in the manner described above, the whole surface of the exposure area on the glass substrate P can be set to a uniform exposure quantity.

When a reticle blind 17 having the light attenuation portion 26 is used, the light attenuation portion 26 may be provided on the left side and the right side, not on the upper side and the lower side of the opening S, and an overlap exposure area extending in the Y direction on the glass substrate P shown in FIG. 2 may be set by a light attenuation area formed by the light attenuation portion 26 to thereby shift the illumination area in the Y direction.

With the exposure method, the exposure apparatus and the mask of this embodiment, the circuit pattern 1a formed on the reticle A is divided at the time of exposure into a common pattern KP used commonly for a plurality of divided patterns A1 and A2, and a non-common pattern HP different from the common pattern KP. Hence, the first pattern and the second pattern can be optionally selected and set by adjusting the illumination area for each exposure, to thereby vary the selection of non-common patterns HP according to a plurality of divided patterns, and transfer can be made to a plurality of divided areas A1 to A4 with one reticle A. Conventionally, when a pattern to be joined and exposed is put in one reticle, it has been necessary to provide a shading zone (for example, 1.5 mm) to separate each pattern independently. On the contrary, when a part of an abutting pattern is overlapped and exposed, as with this embodiment, a pattern in one reticle can be cut out without providing a shading zone. That is to say, a common portion and a non-common portion in one reticle can be repeatedly used depending upon the intended pattern. Therefore, when the same pattern is repeatedly transferred as with a liquid crystal display device and a semiconductor memory, this repetition pattern is designated as a common pattern. Hence the above described effect becomes significant.

Figure 38:
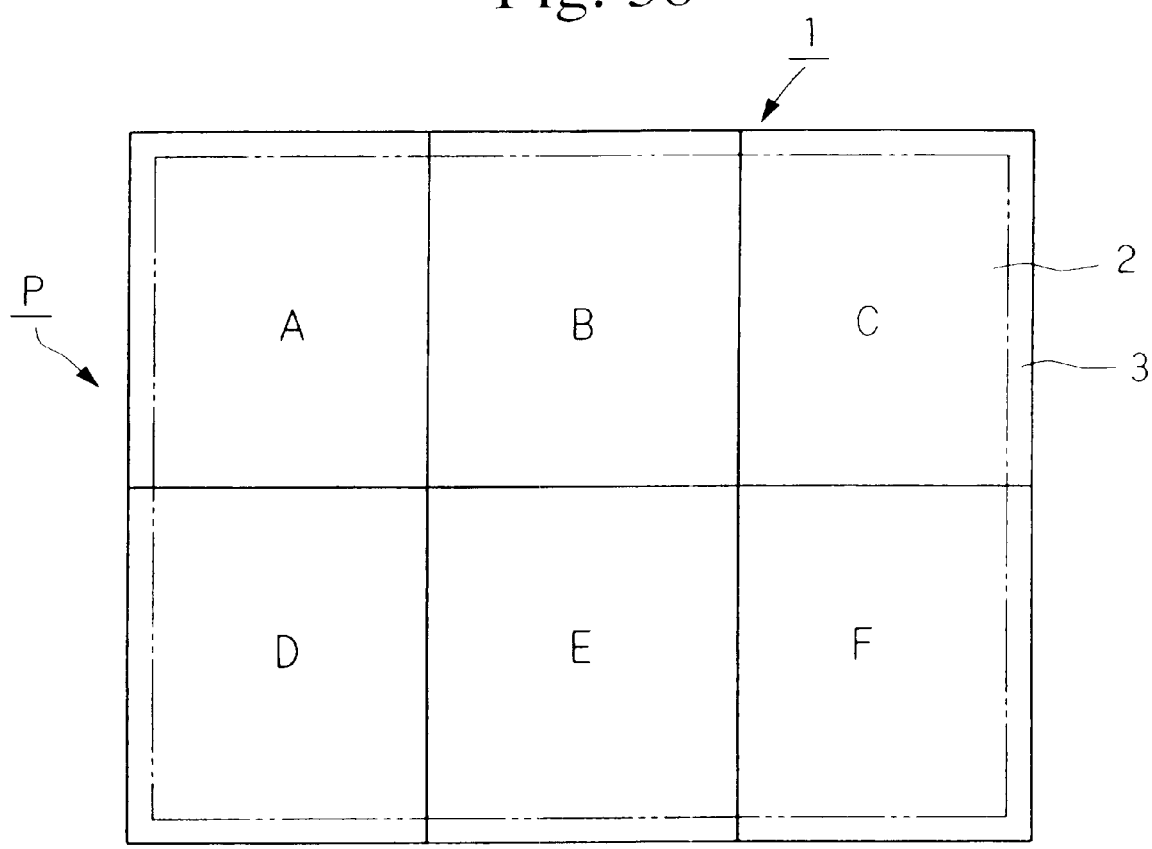
FIG. 38 is a pattern diagram of a glass substrate having a divided circuit pattern.
Figure 39:
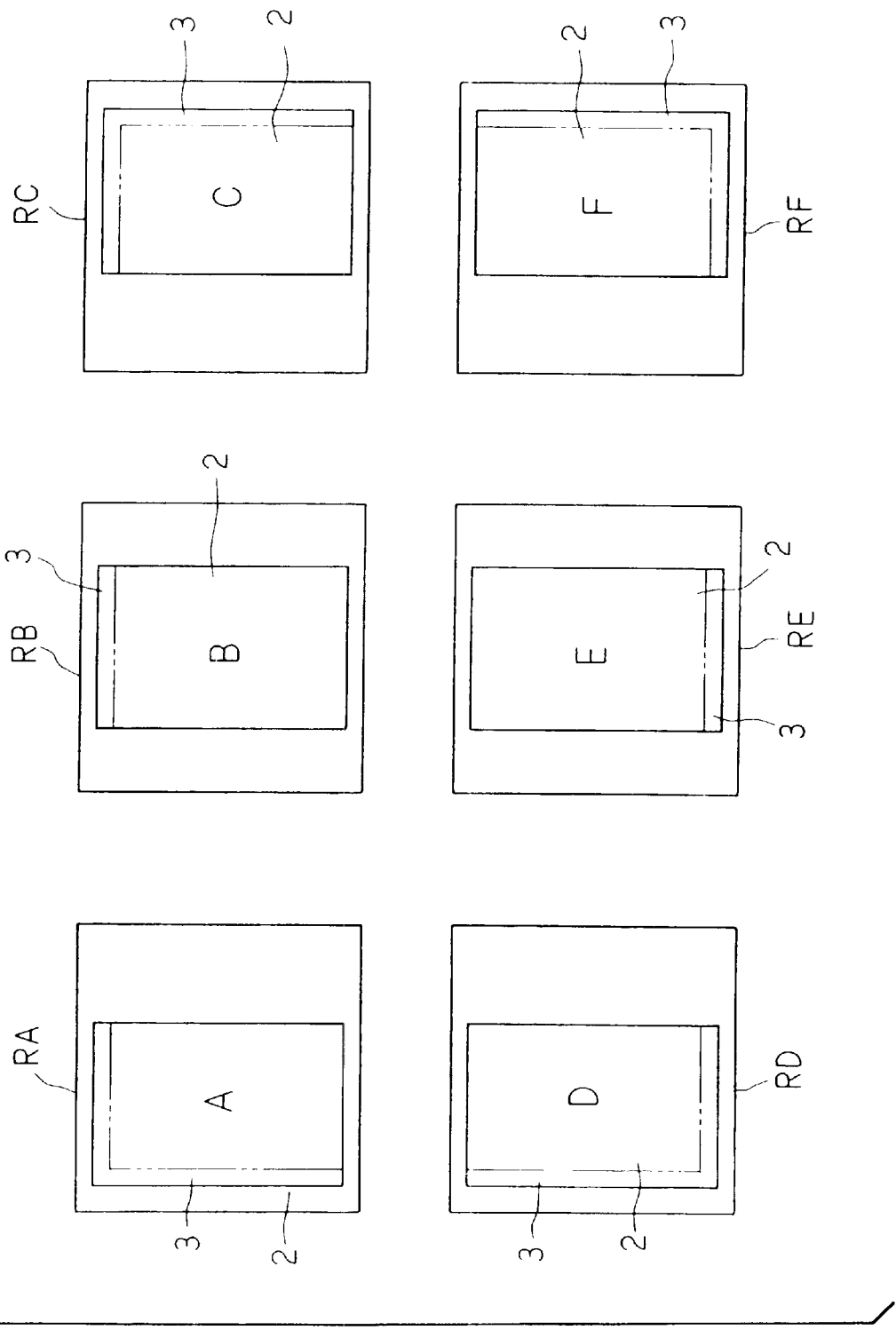
FIG. 39 is a plan view showing one example of a mask according to conventional technology.
Figure 40:
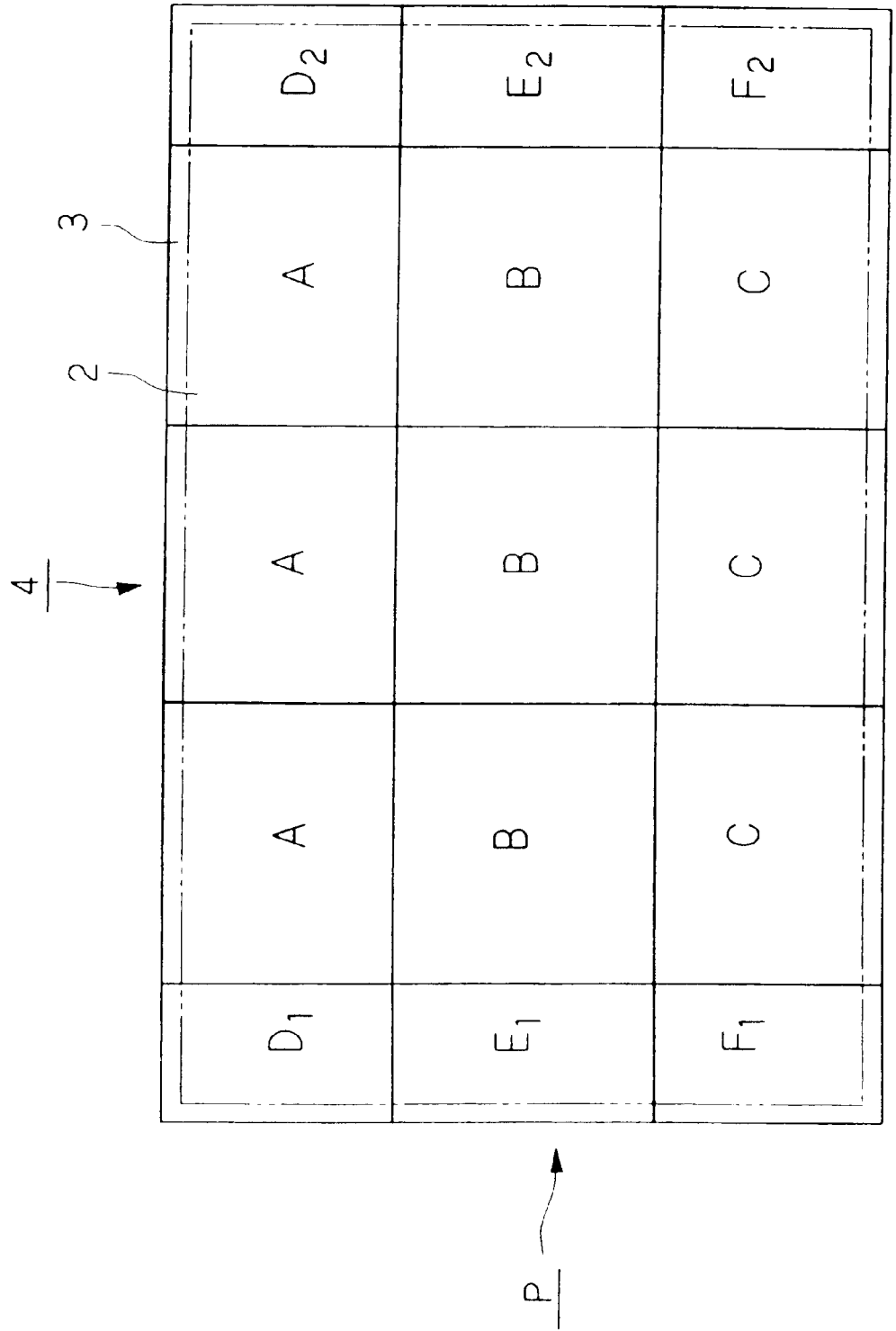
FIG. 40 is a pattern diagram of a glass substrate having a divided circuit pattern.

To obtain a glass substrate P for a 15-inch liquid crystal display device, with this embodiment, the number of divisions increases from 6 to 8 to increase the exposure time, but the number of reticles to be used decreases from 6 to 2, compared to the conventionally divided patterns A to F shown in FIG. 38 and the conventional masks RA to RF shown in FIG. 39. Hence the time required for changing the reticles can be reduced, and as a result, the processing time can be also reduced, to improve the throughput. In addition, the number of expensive reticles to be used can be also reduced, to thereby realize a cost reduction.

Moreover, with this embodiment, since the non-common patterns HP are formed by putting the common pattern KP therebetween, when a predetermined illumination area is set by shifting the reticle blind 17, the distance to shift the reticle blind 17 can be made short, to thereby reduce the time required for setting the illumination area and to realize further throughput improvement.

Furthermore, with this embodiment, when the above described plurality of divided patterns are exposed on the glass substrate P, the drive control unit 11 drives the reticle blind 17 and the substrate stage 9 so as to effect the pattern joining exposure between abutting divided patterns. Hence, even if the circuit pattern 1 is divided, it is possible to prevent a difference in level occurring at the joint portion of the patterns thus impairing the property of the device, or the joint discontinuously changing and thus deteriorating the quality of the device.

On the other hand, with this embodiment, when the reticle blind 17 is constituted by the blind plates 17a and 17b having the shading portion 24 and the transmission portion 25, a pair of exposure areas arranged in a rectangular shape is formed by two exposure areas having one side overlapped with each other, and in each pair, the illumination area corresponding to the exposure area is respectively shifted along the same direction in the diagonal direction. As a result, even in an area where the exposure areas intersect, over exposure is not caused, and the exposure can be effected with the same exposure quantity as that of other exposure areas.

Furthermore, when the reticle blind 17 is constituted by the blind plates 17c and 17d having the shading portion 24, the transmission portion 25 and the light attenuation portion 26, the illumination area corresponding to the exposure area arranged in a rectangular shape is respectively shifted along the lengthwise direction of the light attenuation portion 26. As a result, even in an area where the exposure areas intersect, over exposure is not caused, and the exposure can be effected with the same exposure quantity as that of other exposure areas. Moreover, in this case, since the shift of the blind plates 17c and 17d is in one direction, the drive mechanism 20 for driving the blind plates 17c and 17d can be made simple.

FIGS. 24 to 37 are views showing a second embodiment of the exposure method, the exposure apparatus and the mask of the present invention.

In these figures, the same numerals are given to the same constituents as those of the first embodiment shown in FIGS. 1 to 23 and their description is omitted.

The point different between the second embodiment and the first embodiment is the circuit pattern transferred onto the glass substrate P.

Figure 24:
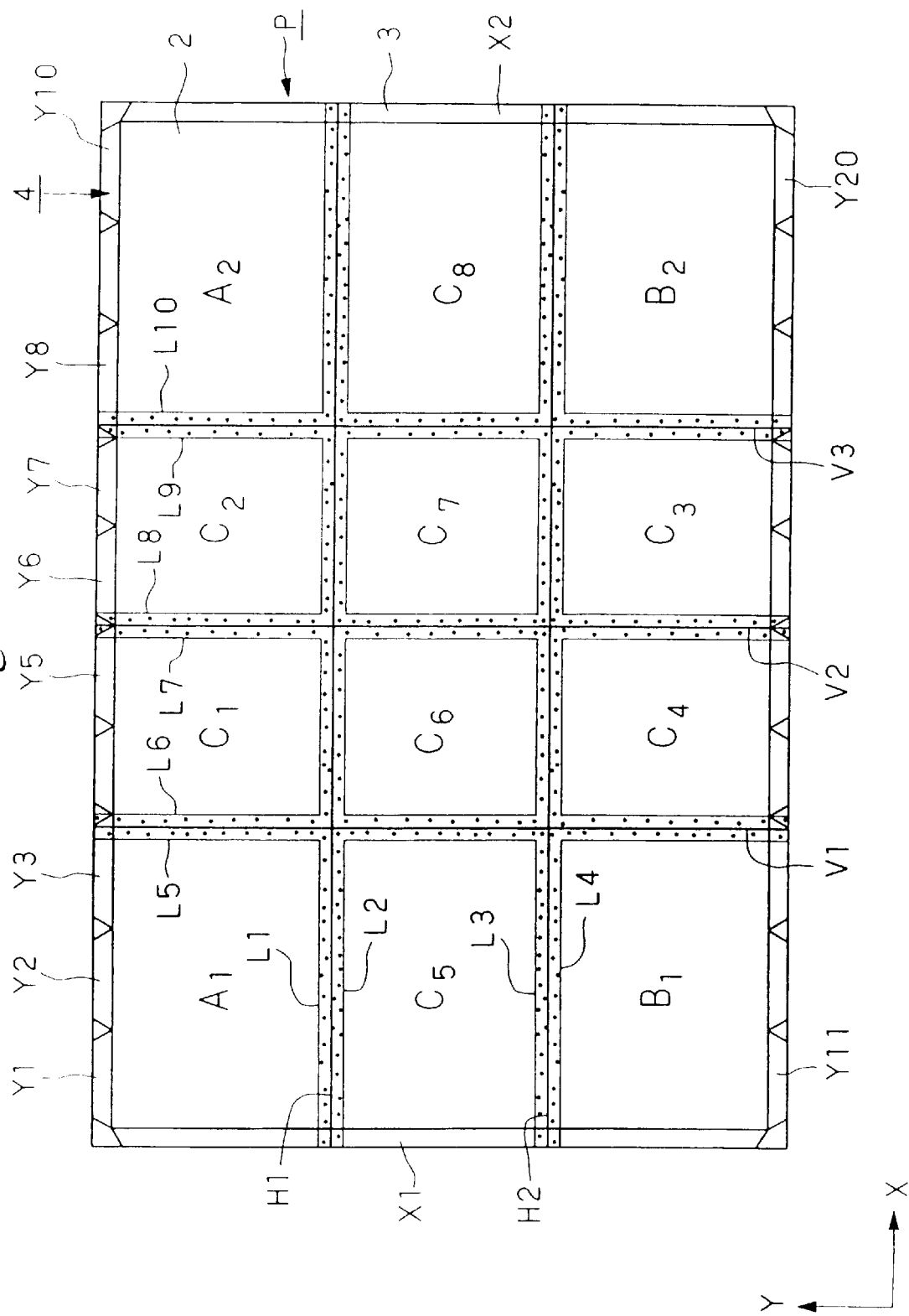
FIG. 24 is a view showing a second embodiment of the present invention, being a pattern diagram of a glass substrate for a 21-inch liquid crystal display device.

That is to say, the glass substrate P shown in FIG. 24 is for producing the above described 21-inch liquid crystal display device. Of a circuit pattern 4 transferred onto the glass substrate P, a peripheral portion 3 comprises trapezoidal tabs X1 and X2 disposed one each at opposite ends in the X direction of a display section 2, and trapezoidal tabs Y1 to Y10 and Y11 to Y20 disposed in ten positions, respectively, at opposite ends at regular intervals in the Y direction of the display section 2.

The circuit pattern 4 is constructed such that it is synthesized by divided patterns A1 to A2, B1 to B2 and C1 to C8, divided by division lines V1 to V3 extending in the Y direction at predetermined interval in the X direction, and division lines H1 and H2 extending in the X direction. Here, the division line V1 is set to pass in the vicinity of the right end of the tab Y3, the division line V3 is set to pass in the vicinity of the left end of the tab Y8. Moreover, the division line V2 is set to pass between the tab Y5 and the tab Y6. The reticle R for transferring this circuit pattern 4 has a construction using three reticles, that is, reticles (mask) A, B and C shown in FIGS. 25A to 25C. The reticle A is the one used at the time of transferring the divided patterns A1 and A2, and on the surface thereof, there is formed with a predetermined projection magnification with the glass substrate P, a circuit pattern (pattern) 4a comprising a display section 2a and a peripheral section 3a, and a shading zone 23.

The peripheral section 3a is constituted by tabs X1 and X12 provided at opposite ends of the display section 2a in the X direction, and three tabs Y21 to Y23 provided at the end of the display section 2a in the +Y direction. The tabs X1 and X12 have a range including a little in the −Y direction from the division line H1, of the pattern which is transferred to tabs X1 and X2 on the glass substrate P. Similarly, the tabs Y21 to Y23 respectively have the patterns to be transferred to the tabs Y1 to Y10 on the glass substrate P.

The display section 2a partially has the pattern of the display section 2 to be transferred to the glass substrate P. The width of the display section 2a is the total length of three tabs Y21 to Y23 in the X direction, and in the Y direction, the display section 2a has a length corresponding to the length including a little in the −Y direction from the division line H1, of the pattern which the display section 2 transfers, as with the above described tabs X11 and X12.

Moreover, in the reticle A, as shown in FIG. 25A, a division line V11 is set so as to extend in the Y direction, passing in the vicinity of the left end of the tab Y21, and a division line V12 is set so as to extend in the Y direction, passing in the vicinity of the right end of the tab Y23. Similarly, a division line H11 is set so as to extend in the X direction, at a position corresponding to the division line H1.

The reticle B is for use at the time of transferring the divided patterns B1 and B2, and since this has a similar construction to that of the reticle A, this will only be described in brief. On the surface thereof there is formed with a predetermined projection magnification with the glass substrate P, a circuit pattern 4a comprising a display portion 2a and a peripheral portion 3a, and a shading zone 23.

The peripheral portion 3a is constituted by tabs X11 and X12 provided at opposite ends of the display section 2a in the X direction, and three tabs Y24 to Y26 provided at the end of the display section 2a in the −Y direction. The tabs X1 and X12 have a range in the Y direction from the division line H2, including a little in the +Y direction from the division line H2, of the pattern which is transferred to the tabs X1 and X2 on the glass substrate P. Similarly, the tabs Y24 to Y26 respectively have the patterns to be transferred to the tabs Y11 to Y20 on the glass substrate P.

The display section 2a partially has the pattern in the display section 2 to be transferred to the glass plate P. The width of the display section 2a is the total length of three tabs Y24 to Y26 in the X direction, and in the Y direction, the display section 2a has a length corresponding to the length in the −Y direction from the division line H2, including a little in the +Y direction from the division line H2, of the pattern which the display section 2 transfers, as with the above described tabs X1 and X12.

Moreover, in the reticle B, as shown in FIG. 25B, a division line V13 is set so as to extend in the Y direction, passing in the vicinity of the left end of the tab Y24, and a division line V14 is set so as to extend in the Y direction, passing in the vicinity of the right end of the tab Y26. Similarly, a division line H12 is set so as to extend in the X direction, at a position corresponding to the division line H2.

On the other hand, the reticle C is for use at the time of transferring the divided patterns C1 to C8. On the surface thereof there is formed with a predetermined projection magnification with the glass substrate P, a circuit pattern 4a comprising a display portion 2a and a peripheral portion 3a, and a shading zone 23.

The peripheral portion 3a of the reticle C is constituted by tabs X11 and X12 provided at opposite ends of the display section 2a in the X direction, and tabs Y31 to Y34, and Y35 to Y38 provided at opposite ends of the display section 2a in the Y direction. The tabs X11 and X12 have a range including a little in the −Y direction from the division line H1, of the pattern which is transferred to the tabs X1 and X2 on the glass substrate P. Similarly, the tabs Y31 to Y38 respectively have the patterns to be transferred to the tabs Y1 to Y20 on the glass substrate P.

Of these, the tab Y33 has only a length capable of being overlapped and exposed with the tab Y23 of the reticle A. Moreover, the tab Y34 has only a length capable of being joined and exposed with the tab Y21 of the reticle A. The tabs Y37 and Y38 have similar lengths.

The width of the display section 2a is the same as that of the display section 2a of the reticle A in the X direction, and in the Y direction, is the width in the Y direction of the divided patterns C5 to C8, added with a length capable of overlapping exposure.

Furthermore, in the reticle C, a division line V21 passing through the tab Y33 is set to extend in the Y direction so as to correspond with the positional relationship between the tab Y23 of the reticle A and the division line V12. Similarly, a division line V22 passing through the tab Y34 is set to extend in the Y direction so as to correspond with the positional relationship between the tab Y21 of the reticle A and the division line V11. Moreover, the division line V24 is set to extend in the Y direction between the tabs Y32 and Y34.

Moreover, with the reticle C, a division line H21 is set to extend in the X direction at a position where it is slightly offset in the −Y direction with respect to the upper side of the display section 2a. Moreover, a division line H22 is set to extend in the X direction at a position where it is slightly offset in the +Y direction with respect to the lower side of the display section 2a.

Other construction is the same as that of the first embodiment described above.

A procedure for transferring the circuit pattern 4 onto the glass substrate P by using the above described reticles A, B and C will be described. Here, it is assumed that the illumination area is set by the reticle blind 17 comprising the blind plates 17a and 17b shown in FIG. 4A.

At first, once the reticle A is set on the reticle stage 10, the drive control unit 11 reads the data in the exposure area setting section 21, to drive the blind plates 17a and 17b of the reticle blind 17 via the drive mechanism 20. As a result, a rectangular illumination area SA1 corresponding to the divided pattern A1 is set on the reticle A, corresponding to the opening S of the reticle blind 17. The divided pattern A1 comprises a common pattern KP and a non-common pattern HP1.

Here, the division line V12 of the reticle A shown in FIG. 25A is set to the division line V1 on the glass substrate P shown in FIG. 24. At the same time, the division line H11 is set to the division line H1 on the glass substrate P.

At this time, the right side of the illumination area SA1 is set corresponding to the overlapped exposure width, by offsetting toward the −X side with respect to the set division line V12. Similarly, the lower side of the illumination area SA1 is set corresponding to the overlapped exposure width, by offsetting toward the +Y side with respect to the set division line H11. Moreover, the left side and the upper side of the illumination area SA1 are set so as to be exposed with a width larger than the overlapped exposure width of the shading zone 23.

Figure 26A:
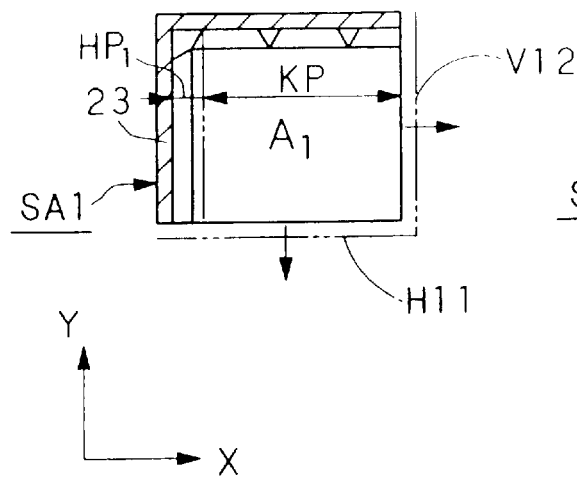
FIGS. 26A and 26B are views showing the second embodiment of the present invention, being plan views showing a pattern of a reticle in the first illumination area.
Figure 26B:
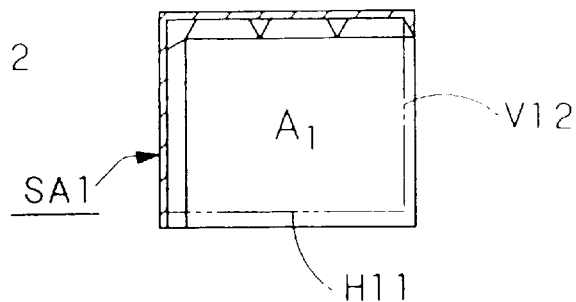

With setting of the illumination area SA1 completed, the substrate stage 9 shifts to a position corresponding to the set illumination area SA1, under the control of the drive control unit 11. When the exposure processing is performed in this state, the pattern existing in the illumination area SA1 of the reticle A, that is, the divided pattern A1 is transferred onto the glass substrate P. At the time of this exposure processing, the reticle blind 17 shifts in the +X direction and in the −Y direction. Hence, as shown in FIG. 26B, the illumination area SA1 shifts by the overlapped exposure width, to thereby gradually reduce the exposure energy quantity of this portion at a certain ratio.

Figure 27A:
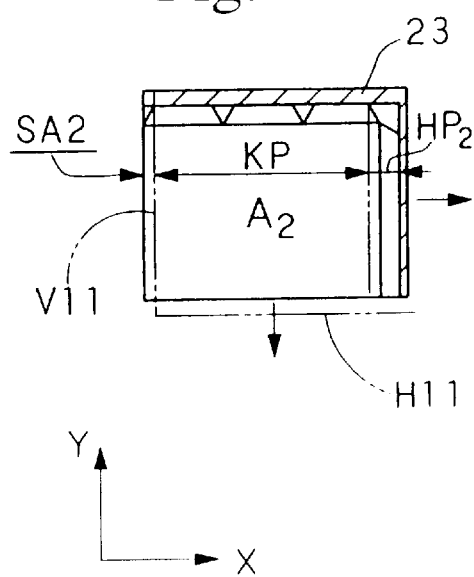
FIGS. 27A and 27B are views showing the second embodiment of the present invention, being plan views showing a pattern of a reticle in other illumination areas.
Figure 27B:
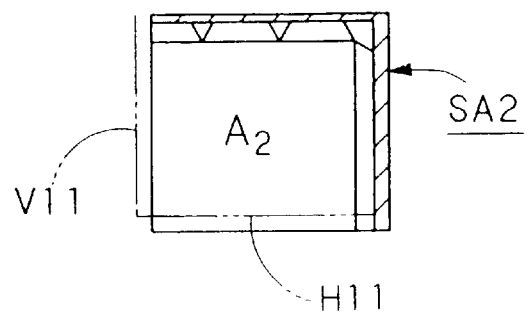

Subsequently, in the same manner as described above, the reticle blind 17 is driven to set a rectangular illumination area SA2 corresponding to the divided pattern A2, as shown in FIG. 27A. The divided pattern A2 comprises a common pattern KP and a non-common pattern HP2. Here, the division line V11 of the reticle A is set to the division line V3 on the glass substrate P. At the same time, the division line H11 of the reticle A is set to the division line H1 on the glass substrate P. Then, after the substrate stage 9 has been shifted, the exposure processing is performed while shifting the reticle blind 17. Hence, as shown in FIG. 27B, the illumination area SA2 shifts, to thereby transfer the divided pattern A2 having an overlapped exposure portion, onto the glass substrate P.

Figure 28A:
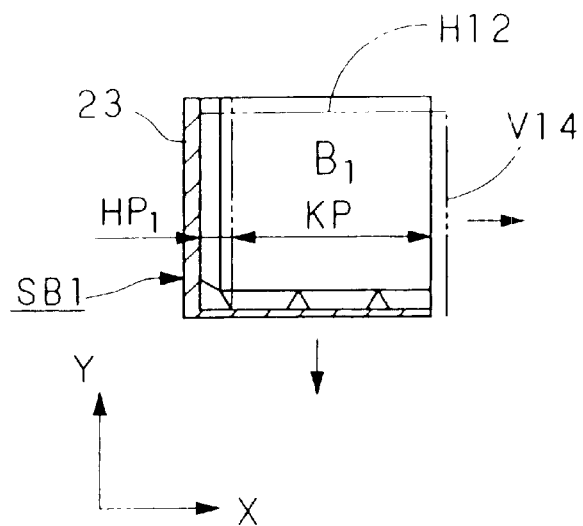
FIGS. 28A and 28B are views showing the second embodiment of the present invention, being plan views showing a pattern of another reticle in other illumination areas.

Thereafter, the reticle A is changed to a reticle B by the reticle changing apparatus, and in a similar procedure as with the reticle A, divided patterns B1 and B2 are sequentially transferred onto the glass substrate P. More specifically, at first a rectangular illumination area SB1 corresponding to the divided pattern B1 is set on the reticle B, as shown in FIG. 28A, corresponding to the opening S of the blind plates 17a and 17b of the reticle blind 17. This divided pattern B1 comprises a common pattern KP and a non-common pattern HP1. Here, the division line V14 of the reticle B is set to the division line V1 on the glass substrate P. At the same time, the division line H12 is set to the division line H2 on the glass substrate P.

At this time, the right side of the illumination area SB1 (the side on the +X side) is set corresponding to the overlapped width at the time of pattern joining exposure, by offsetting toward the −X side with respect to the set division line V14. Similarly, the upper side of the illumination area SB1 (the side on the +Y side) is set corresponding to the overlapped exposure width, by offsetting toward the +Y side with respect to the set division line H12. Moreover, the left side (the side on the −X side) thereof is set so as to be exposed a width larger than the overlapped exposure width of the shading zone 23, and the lower side (the side on the −Y side) is set so that the shading zone 23 is exposed.

Figure 28B:
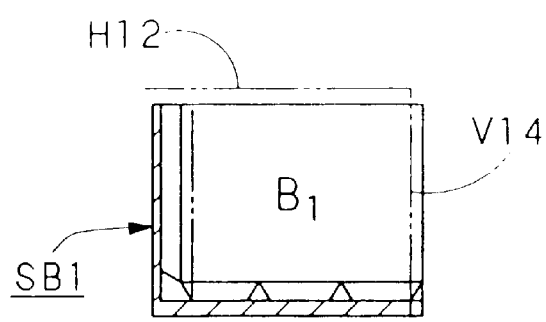

Then, after the substrate stage 9 has been shifted to a position where the glass substrate P corresponds to the illumination area SB1, the exposure processing is performed in the same manner as described above to thereby transfer a pattern image of the reticle B existing in the illumination area SB1 to the exposure area on the glass substrate P. Here, at the time of the exposure processing, based on the instruction of the drive control unit 11, the blind plates 17a and 17b of the reticle blind 17 shift. As a result, as shown in FIG. 28B, the illumination area SB1 shifts by the width to be overlapped and exposed at a predetermined speed such that the right side thereof shifts toward the +X direction and the lower side thereof shifts toward the −Y direction, respectively (that is, in FIGS. 28A and 28B, from the upper left side to the lower right side).

Figure 29A:
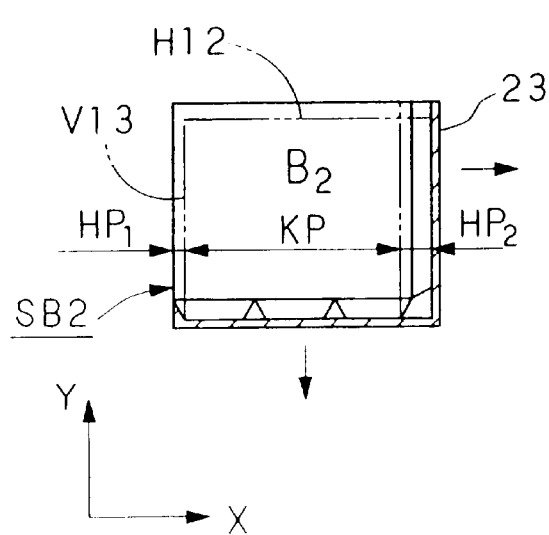
FIGS. 29A and 29B are plan views showing a pattern of a reticle in other illumination areas.
Figure 29B:
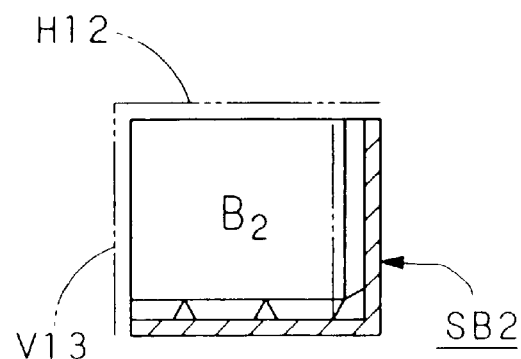

Thereafter, with the similar procedure as described above, by shifting the illumination area SB2 corresponding to the divided pattern B2 from the +Y and −X side to the −Y and +X side (that is, in FIGS. 29A and 29B, from the upper left to the lower right), the divided pattern B2 set as shown in FIGS. 29A and 29B is sequentially transferred to the exposure area on the glass substrate P corresponding to the illumination area SB2 so that the abutting divided patterns are joined and exposed. After the exposure processing using the reticle B has been finished, the reticle B is changed to the reticle C.

Figure 30A:
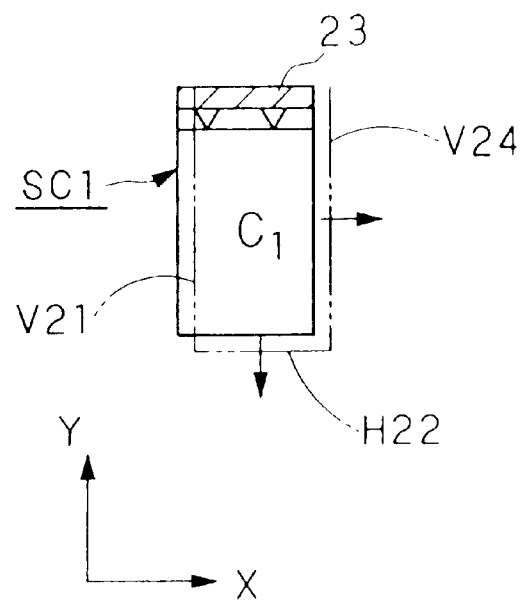
FIGS. 30A and 30B are views showing the second embodiment of the present invention, being plan views showing a pattern of a reticle in a second illumination area.

When the reticle C is set, the reticle blind 17 is driven, and a rectangular illumination area SC1 (a first illumination area) corresponding to the divided pattern C1 serving as the first pattern is set on the reticle C, as shown in FIG. 30A, corresponding to the opening S of the blind plates 17a and 17b of the reticle blind 17. This divided pattern C1 comprises a common pattern KP and a non-common pattern HP1. Here, the division line V21 of the reticle C is set to the division line V1 on the glass substrate P. Moreover, the division line V24 of the reticle C is set to the division line V2 on the glass substrate P. At the same time, the division line H22 is set to the division line H1 on the glass substrate P.

Figure 30B:
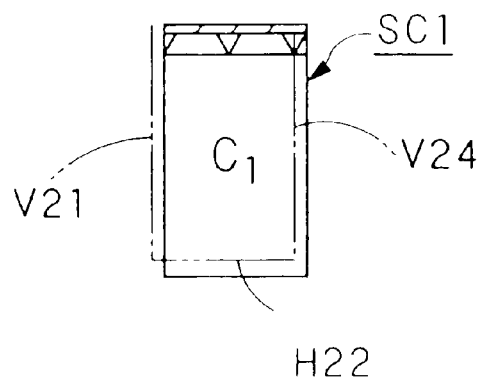

Then, after the substrate stage 9 has been shifted, the exposure processing is performed while shifting the reticle blind 17 to thereby shift the illumination area SC1, as shown in FIG. 30B, and transfer the divided pattern C1 having an overlapped exposure portion onto the glass substrate P. Hence, the above described divided pattern A1 and the divided pattern C1 are joined and exposed.

Figure 31A:
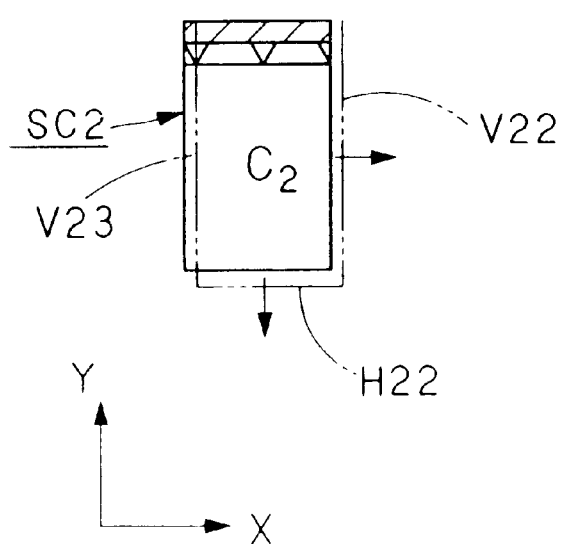
FIGS. 31A and 31B are views showing the second embodiment of the present invention, being plan views showing a pattern of a reticle in other illumination areas.

Subsequently, the reticle blind 17 is driven to set a rectangular illumination area (a second illumination area) SC2 corresponding to the divided pattern C2 serving as the second pattern, as shown in FIG. 31A. The divided pattern C2 comprises a common pattern KP and a non-common pattern HP2. Here, the division line V22 of the reticle C is set to the division line V3 on the glass substrate P. Moreover, the division line V23 of the reticle C is set to the division line V2 on the glass substrate P. At the same time, the division line H22 is set to the division line H1 on the glass substrate P.

Figure 31B:
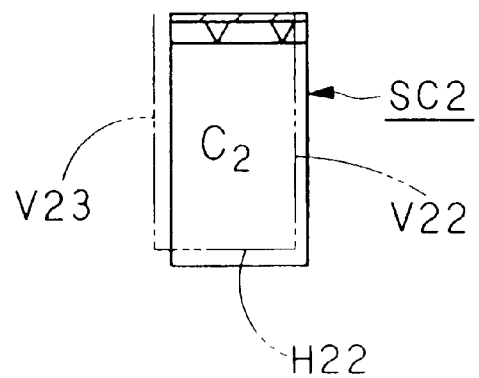
Figure 32A:
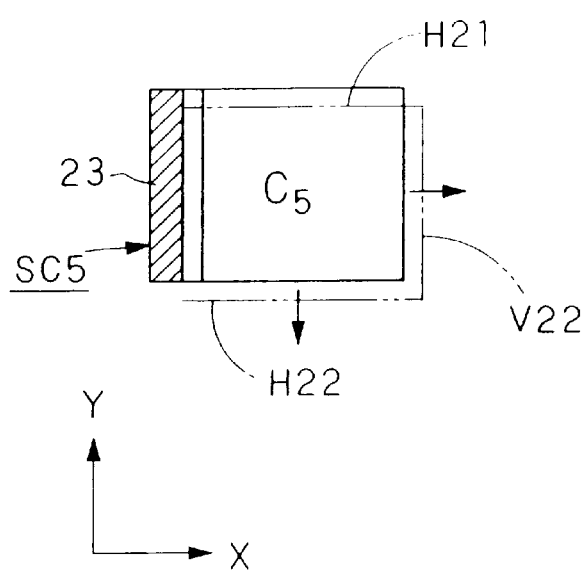
FIGS. 32A and 32B are plan views showing a pattern of a reticle in the other illumination areas.
Figure 32B:
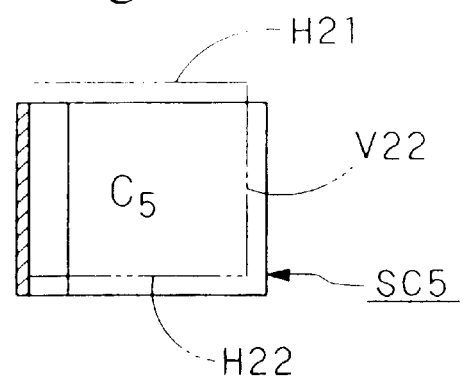
Figure 33A:
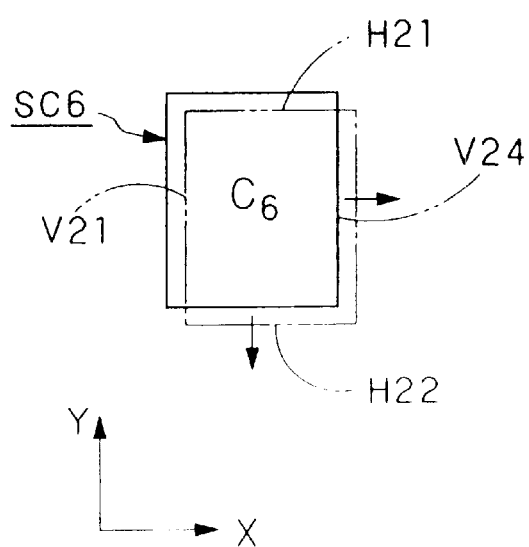
FIGS. 33A and 33B are plan views showing a pattern of a reticle in the other illumination areas.
Figure 33B:
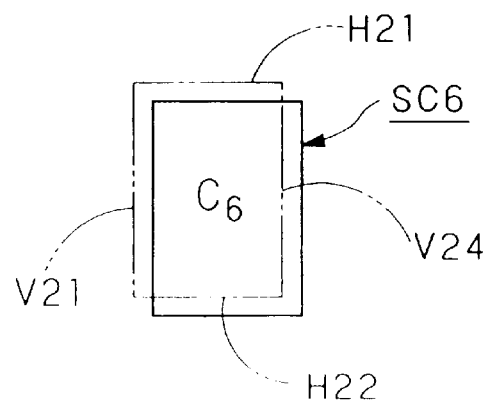
Figure 34A:
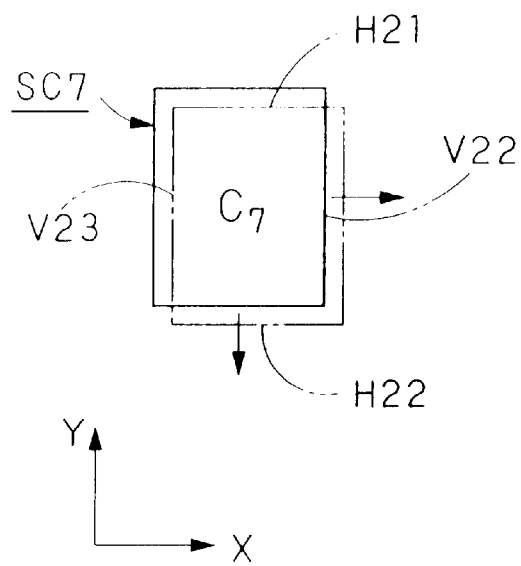
FIGS. 34A and 34B are plan views showing a pattern of a reticle in the other illumination areas.
Figure 34B:
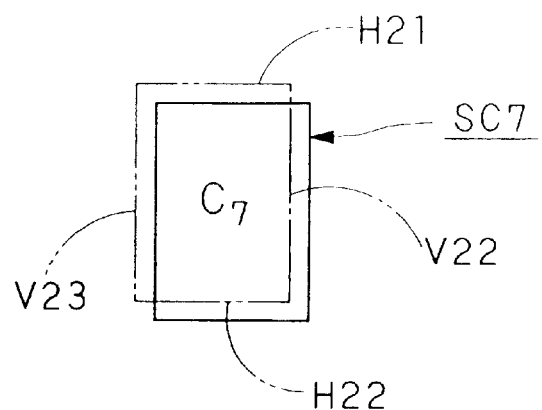
Figure 35A:
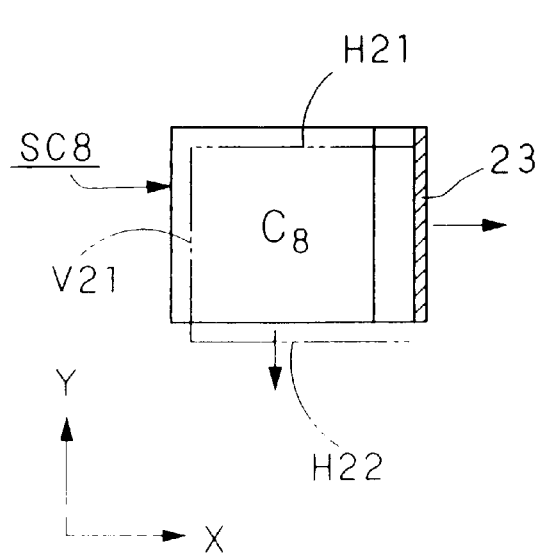
FIGS. 35A and 35B are plan views showing a pattern of a reticle in the other illumination areas.
Figure 35B:
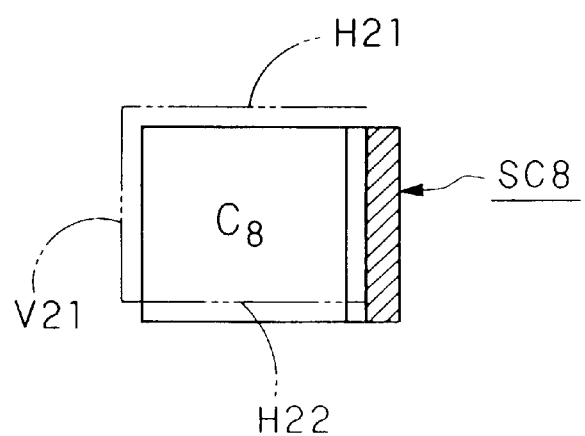
Figure 36A:
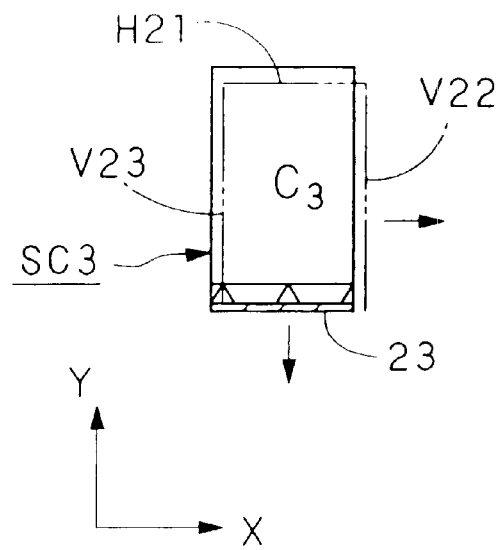
FIGS. 36A and 36B are plan views showing a pattern of a reticle in the other illumination areas.
Figure 36B:
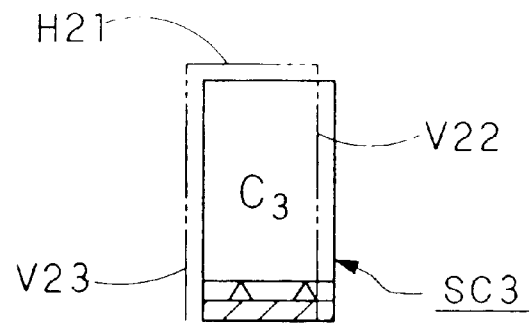
Figure 37A:
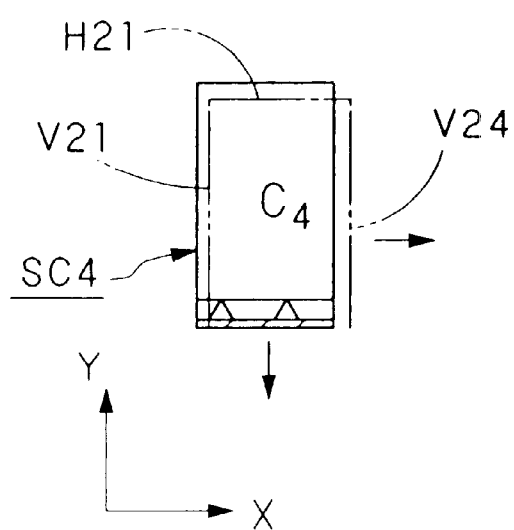
FIGS. 37A and 37B are plan views showing a pattern of a reticle in the other illumination areas.
Figure 37B:
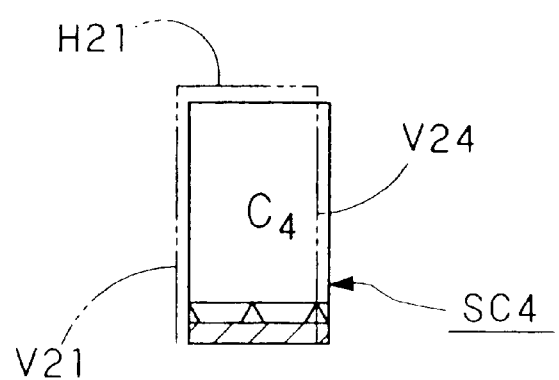

Then, after the substrate stage 9 has been shifted, the exposure processing is performed while shifting the reticle blind 17. Hence, as shown in FIG. 31B, the illumination area SC2 shifts, to thereby transfer the divided pattern C2 having an overlapped exposure portion onto the glass substrate P. Hence, the above described divided pattern C1 and the divided pattern C2, and the above described divided pattern A2 and the divided pattern C2 are joined and exposed.

Thereafter, the reticle blind 17 is driven to sequentially set the illumination areas SC5 to SC8 and SC3 to SC4, with respect to division lines of the divided patterns C5 to C8 and C3 to C4, on the +Y side and −X side (in each figure, toward the upper left side) from the division line, as shown in FIGS. 32A to 37A. Then, after the substrate stage 9 has been shifted, the reticle blind 17 is shifted to sequentially perform the exposure processing, while shifting the illumination areas SC5 to SC8 and SC3 to SC4 toward the −Y side and +X side (in each figure, toward the lower right side), as shown in FIGS. 32B to 37B. Hence, by using the common pattern and the non-common pattern of the reticle C for each divided pattern, divided patterns C5 to C8 and C3 to C4 can be transferred onto the glass substrate P sequentially. As a result, the joined and exposed circuit pattern 4 is transferred onto the glass substrate P.

Also with this exposure, as with the above described first embodiment, if a plurality of pairs are constituted by two exposure areas whose one side is overlapped (two abutting exposure areas) with respect to the exposure area arranged in a rectangular shape, and the illumination area in each pair, corresponding to each exposure area, is shifted in the same direction, the intersection portion in each pair is exposed with an exposure quantity distribution in a quadrangular pyramid shape and a triangular pyramid shape. Hence, the exposure quantity distribution combining two pairs becomes the shape of two quadrangular pyramids and two triangular pyramids, enabling the exposure with 100% exposure quantity.

Figure 4B:
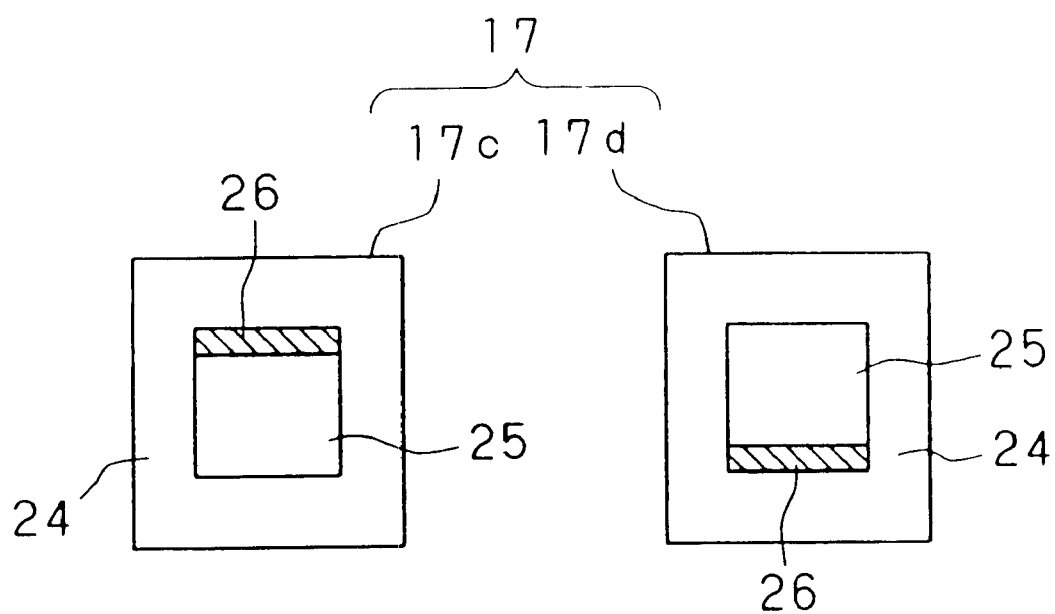
FIG. 4B is a plan view of a blind plate comprising a shading portion, a transmission portion and a light attenuation portion.

Moreover, if the blind plates 17c and 17d shown in FIG. 4B are used as the reticle blind 17, then as shown in FIG. 24, at the time of respectively transferring the divided patterns A1 to A2 and C1 to C2 where an overlapped exposure area is set on the lower side, the light attenuation portion 26 of the blind plate 17d is located on the lower side of the opening S, and the light attenuation area formed by the light attenuation portion 26 is located in an overlapped exposure area between the lines L1 and L2, to thereby set the respective illumination areas SA1 to SA2 and SC1 to SC2, and during exposure the respective illumination areas SA1 to SA2 and SC1 to SC2 are shifted in the lengthwise direction of the light attenuation portion 26 (in the X direction). Furthermore, when the divided patterns B1 to B2 and C3 to C4 where an overlapped exposure area is set on the upper side, are respectively transferred, the light attenuation portion 26 of the blind plate 17c is located on the upper side of the opening S, and the light attenuation area formed by the light attenuation portion 26 is located in an overlapped exposure area between the lines 13 and L4, to thereby set the respective illumination areas SB1 to SB2 and SC3 to SC4, and during exposure the respective illumination areas SB1 to SB2 and SC3 to SC4 are shifted in the lengthwise direction of the light attenuation portion 26 (in the X direction). When the divided patterns C5 to C8 where overlapped exposure areas are set on both the upper side and the lower side, are respectively transferred, the light attenuation portion of the blind plates 17c and 17d is located on the upper side and the lower side of the opening S, and the light attenuation area formed by the light attenuation portion 26 is located in both the overlapped exposure areas between the lines L1 and L2 and between the lines L3 and L4, to thereby set the respective illumination areas SC5 to SC8, and during exposure the respective illumination areas SC5 to SC8 are shifted in the lengthwise direction of the light attenuation portion 26 (in the X direction). As a result, even in an overlapped exposure area where only a side is overlapped, and in an overlapped exposure area where rectangularly arranged exposure areas intersect, as with the above described first embodiment, the exposure can be effected with the same exposure quantity of 100% as that of the non-overlapped exposure areas.

When a reticle blind 17 having a light attenuation portion 26 is used, the light attenuation portion 26 may be provided on the left and right sides, not on the upper and lower sides, of the opening S, and an overlapped exposure area extending in the Y direction on the glass substrate P shown in FIG. 24 may be set by a light attenuation area formed by the light attenuation portion, to thereby shift the illumination area in the Y direction.

With the exposure method, the exposure apparatus and the mask of this embodiment, in addition to the similar effect obtained as with the first embodiment, since the common patterns increase with the increase in size of the circuit pattern, the effect accompanying the decrease in number of used reticles becomes larger. That is to say, with this embodiment, compared to the case of the conventional divided patterns A to F2 shown in FIG. 40, and the conventional masks RA to RF shown in FIG. 41, the divided number decreases from 15 to 12, thereby reducing the exposure time. Moreover, the number of reticles to be used decreases from 6 to 3. Hence the time required for changing the reticles can be reduced, thereby shortening the processing time and improving the throughput.

The number of reticles, and the number and size of divided patterns on the glass substrate P in the above described embodiment are only examples, and are not limited thereto, and various numbers and sizes may be used.

With the above embodiment, the construction is such that the reticle blind 17 comprises blinds plates 17a and 17b, or the blind plates 17c and 17d, and the opening S is formed by combination of two orthogonal sides of the transmission portion 25 of one blind plate and two orthogonal sides of the transmission portion 25 of the other blind plate. However, the construction thereof may be such that a plurality of sides constituting the transmission portion 25 are constructed by respectively independent side constituents (constructed by four side constituents, in the case of a rectangular transmission portion) without using a blind plate, and a shift apparatus for shifting each side constituent respectively and independently is provided.

In this case, by shifting the side constituents similarly as with the blind plates 17a and 17b, the same operation and effect can be obtained as with the case where the blind plates 17a and 17b are used. Moreover, by forming a light attenuation portion in at least one of the side constituents, the same operation and effect can be obtained as with the case where the blind plates 17c and 17d are used. Furthermore, if a light attenuation portion is formed in a part of one side constituent, and this light attenuation portion is exposed or shaded according to the position of the other side constituents, then either of the exposure processing using the above described light attenuation portion or the exposure processing not using the light attenuation portion can be properly selected, enabling pattern joining exposure having wide generality.

As a substrate, not only a glass substrate P for a liquid crystal display device, but also a semiconductor wafer for a semiconductor device, a ceramic wafer for a thin-film magnetic head, an original of a mask or a reticle used with an exposure apparatus (synthetic quartz, silicon wafer) or the like is applicable.

As an exposure apparatus 5, a projection exposure apparatus of the step and repeat type (stepper) wherein a pattern of a reticle R is exposed in a state with the reticle R and a glass substrate P stationary and the glass substrate P is sequentially shifted step by step, or a scanning type projection exposure apparatus of the step and scan type (scanning stepper) wherein a pattern of a reticle R is exposed by simultaneously shifting the reticle R and a photosensitive substrate P is applicable.

As kinds of exposure apparatus 5, the exposure apparatus 5 can be widely applied not only to an exposure apparatus for the production of the above described liquid crystal display device, but also to an exposure apparatus for producing semiconductors, and an exposure apparatus for producing thin-film magnetic heads, image-sensing devices (CCD) or reticles R.

Moreover, as a light source for the illumination optical system 7, there can be used the emission beam generated by the mercury lamp 6 (g-line (436 nm) and i-line (365 nm)), a KrF excimer laser (248 nm), an ArF excimer laser (193 nm), an F2 laser (157 nm), an X-ray and the like. Furthermore, a high frequency wave such as a YAG laser or a semiconductor laser may be used.

The magnification of the projection optical system 8 may involve not only a reduction system but may also involve an equal magnification or enlarging system.

Moreover, as the projection optical system 8, when a far-ultraviolet ray such as an excimer laser is used, a material which transmits the far-ultraviolet ray, such as quartz or fluorite, is used as a the glass material, and when an F2 laser is used, a reflection/refraction system or a refraction system is used as the optical system.

When a linear motor is used for the substrate stage 9 or the reticle stage 10, either of an air floating type using an air bearing, or a magnetic floating type using Lorentz force or reactance force may be used.

Moreover, each stage 9 and 10 may be a type which moves along a guide, or a guideless type without a guide.

The reaction force generated by the movement of the substrate stage 9 may be dispersed mechanically to the floor (ground) using a frame member.

The reaction force generated by the movement of the reticle stage 10 may be dispersed mechanically to the floor (ground) using a frame member.

The exposure apparatus 5 of this embodiment can be produced by respectively incorporating an illumination optical system 7 comprising a plurality of optical elements, and a projection optical system 8, in the exposure apparatus body and adjusting them, and attaching a reticle stage 10 and a substrate stage 9 comprising a plurality of mechanical parts to the exposure apparatus body, and connecting wiring and piping, and performing general adjustment (electrical adjustment, operation confirmation and the like). The production of the exposure apparatus 5 is preferably performed in a clean room where temperature, cleanliness and the like are controlled.

Devices such as liquid crystal display elements and a semiconductor devices are produced through steps such as; a step for designing the function and performance of each device, a step for manufacturing reticles r based on the designing step, a step for manufacturing glass substrates p and wafers, a step for exposing a pattern of the reticle R onto a glass substrate or a wafer by means of the exposure apparatus 5 of the above described embodiments, a step for assembling each device, and an inspection step.

What is claimed is:

1. An exposure method for exposing a first pattern and a second pattern on a substrate with a beam using a mask having a pattern, comprising:

preparing the pattern which includes a common pattern for the first pattern and the second pattern, and a non-common pattern different from the common pattern and formed continuously with the common pattern, selecting the common pattern and at least a part of the non-common pattern as the first pattern;

exposing the first pattern using the common pattern and at least a part of the non-common pattern;

selecting the common pattern and at least a part of the non-common pattern as the second pattern; and exposing the second pattern using the common pattern and at least a part of the non-common pattern so as to join the first pattern.

2. An exposure method according to claim 1, wherein the non-common pattern is formed on either side of the common pattern.

3. An exposure method according to claim 1, wherein the selection of the non-common pattern is different for when the first pattern is exposed than when the second pattern is exposed.

4. An exposure method according to claim 1, wherein selecting the common pattern and at least a part of the non-common pattern is performed by an illumination area of the mask, and an exposure area on the substrate corresponding to the illumination area is overlapped on an adjacent exposure area, forming exposure area sets whose sides are overlapped, to perform on the joining and exposing.

5. An exposure method according to claim 4, wherein a light attenuation area where the transmittance gradually changes is formed on one side of the illumination area, and when the exposure area is arranged as a plurality of rectangles with respective two sides overlapped, illumination areas corresponding to each exposure area are shifted respectively along the one side during the exposure.

6. An exposure method according to claim 4, wherein when the exposure area is arranged as a plurality of rectangles with respective two sides overlapped, pairs are severally constructed by the exposure area sets whose sides are overlapped, and in each pair illumination areas corresponding to the exposure area are respectively shifted along the same direction during the exposure.

7. An exposure method according to claim 6, wherein the same direction is the diagonal direction of the plurality of rectangles.

8. An exposure method according to claim 1, wherein the non-common pattern is formed continuously with the common pattern without a shading zone that shades at least part of the beam.

9. An exposure method according to claim 1, further comprising a shading zone that is provided on the mask and shades at least part of the beam, all of the common pattern and the non-common pattern being provided inside of the shading zone.

10. An exposure method according to claim 9, wherein a shape of the shading zone comprises a C shape.

* * * * *